(12) United States Patent
Kim et al.

(10) Patent No.: US 12,107,114 B2
(45) Date of Patent: Oct. 1, 2024

(54) DISPLAY DEVICE

(71) Applicant: Samsung Display Co., LTD., Yongin-si (KR)

(72) Inventors: Hyung Jun Kim, Seoul (KR); So Young Koo, Hwaseong-si (KR); Eok Su Kim, Seoul (KR); Yun Yong Nam, Hwaseong-si (KR); Jun Hyung Lim, Seoul (KR); Kyung Jin Jeon, Incheon (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 446 days.

(21) Appl. No.: 17/471,679

(22) Filed: Sep. 10, 2021

(65) Prior Publication Data

US 2022/0140000 A1    May 5, 2022

(30) Foreign Application Priority Data

Oct. 30, 2020  (KR) .......................... 10-2020-0143395

(51) Int. Cl.
*H01L 27/15*  (2006.01)
*H01L 33/24*  (2010.01)
(Continued)

(52) U.S. Cl.
CPC ............ *H01L 27/156* (2013.01); *H01L 33/24* (2013.01); *H01L 33/38* (2013.01); *H01L 33/44* (2013.01); *H01L 33/60* (2013.01)

(58) Field of Classification Search
CPC ....... H01L 27/156; H01L 33/24; H01L 33/38; H01L 33/44; H01L 33/60; H01L 2933/0091; H01L 33/62; H01L 25/167; H01L 25/0753; H01L 33/58; H01L 27/1214; H01L 27/3244; H01L 27/3279; H10K 59/131; H10K 59/122; H10K 59/123; H10K 71/861; G09G 3/006;
(Continued)

(56) References Cited

U.S. PATENT DOCUMENTS

2018/0366524 A1* 12/2018 Bang ...................... H10K 71/60

FOREIGN PATENT DOCUMENTS

JP          6242121       12/2017
JP          2018-6067      1/2018
(Continued)

*Primary Examiner* — Mohammad A Rahman
(74) *Attorney, Agent, or Firm* — KILE PARK REED & HOUTTEMAN PLLC

(57) ABSTRACT

A display device includes first banks on a substrate and spaced apart from each other, a first electrode and a second electrode on the first banks and spaced apart from each other, a first insulating layer on the first electrode and the second electrode, and light emitting elements on the first insulating layer and each having ends on the first electrode and the second electrode. Each of the first banks includes a first pattern portion including concave portions and convex portions. The first pattern portions of the first banks are disposed on side surfaces of the first banks. The side surfaces are spaced apart and face each other. Each of the first electrode and the second electrode includes a second pattern portion on the first pattern portion and having a pattern shape corresponding to the first pattern portion on a surface thereof.

20 Claims, 24 Drawing Sheets

(51) Int. Cl.
*H01L 33/38* (2010.01)
*H01L 33/44* (2010.01)
*H01L 33/60* (2010.01)

(58) Field of Classification Search
CPC ......... G09G 2320/0295; G09G 3/3233; G09G 2300/0426; G09G 2300/0819; G09G 2330/08; G09G 2300/0452
See application file for complete search history.

(56) References Cited

FOREIGN PATENT DOCUMENTS

| | | |
|---|---|---|
| KR | 10-2004-0063385 | 7/2004 |
| KR | 10-2004-0075361 | 8/2004 |
| KR | 10-2015-0118662 | 10/2015 |
| KR | 10-2020-0085977 | 7/2020 |

* cited by examiner

DISPLAY DEVICE

CROSS-REFERENCE TO RELATED APPLICATION(S)

This application claims priority to and benefits of Korean Patent Application No. 10-2020-0143395 under 35 U.S.C. 119, filed on Oct. 30, 2020 in the Korean Intellectual Property Office, the entire contents of which are herein incorporated by reference.

BACKGROUND

1. Technical Field

The disclosure relates to a display device.

2. Description of the Related Art

Display devices are becoming increasingly important with the development of multimedia. Accordingly, various types of display devices such as organic light emitting displays and liquid crystal displays are being used.

A display device is a device for displaying an image and includes a display panel such as an organic light emitting display panel or a liquid crystal display panel. As a light emitting display panel, the display panel may include light emitting elements such as light emitting diodes (LEDs). For example, the LEDs may be organic light emitting diodes (OLEDs) using an organic material as a fluorescent material or may be inorganic LEDs using an inorganic material as the fluorescent material.

SUMMARY

An aspect of the disclosure is to provide a display device having improved light emission efficiency.

However, aspects of the disclosure are not restricted to the one set forth herein. The above and other aspects of the disclosure will become more apparent to one of ordinary skill in the art to which the disclosure pertains by referencing the detailed description of the disclosure given below.

According to an embodiment of the disclosure, a display device may include first banks disposed on a substrate and spaced apart from each other, a first electrode and a second electrode disposed on the first banks and spaced apart from each other, a first insulating layer disposed on the first electrode and the second electrode, and light emitting elements disposed on the first insulating layer and each having ends on the first electrode and the second electrode. Each of the first banks may include a first pattern portion including concave portions and convex portions. The first pattern portions of the first banks may be disposed on side surfaces of the first banks, the side surfaces being spaced apart and facing each other, and each of the first electrode and the second electrode may include a second pattern portion disposed on the first pattern portion and having a pattern shape corresponding to the first pattern portion on a surface of the second pattern portion.

The first insulating layer may include a third pattern portion disposed on the second pattern portion of each of the first electrode and the second electrode and having a pattern shape corresponding to the second pattern portion on a surface of the third pattern portion.

The display device may further comprise a first contact electrode disposed on the first electrode and contacting the first electrode and an end of the light emitting elements, and a second contact electrode on the second electrode to contact the second electrode and another end of the light emitting elements, wherein each of the first contact electrode and the second contact electrode may include a fourth pattern portion disposed on the third pattern portion and having a pattern shape corresponding to the third pattern portion on a surface of the fourth pattern portion.

The first insulating layer may have a smaller refractive index than each of a refractive index of the first contact electrode and a refractive index of the second contact electrode.

The display device may further comprise a second insulating layer on the light emitting elements, and a third insulating layer on the second insulating layer and the second contact electrode, wherein the first contact electrode may be on the third insulating layer.

The third insulating layer may include a fifth pattern portion disposed on the fourth pattern portion of the second contact electrode and having a pattern shape corresponding to the fourth pattern portion, and the third insulating layer may have a refractive index smaller than the refractive index of the second contact electrode.

The display device may further comprise a fourth insulating layer on the third insulating layer and the first contact electrode, wherein the fourth insulating layer may have a refractive index smaller than the refractive index of the first contact electrode.

Each of the concave portions and convex portions of the first pattern portion may have an outer surface having a curved shape.

The first pattern portion may have a pattern height of half or more of a wavelength of light emitted from the light emitting elements. The pattern height may be defined as a vertical distance between an imaginary extension line connecting lowermost ends of the concave portions and an imaginary extension line connecting uppermost ends of the convex portions.

The display device may further comprise a via layer between the substrate and the first banks.

The display device may further comprise a second bank disposed on the first banks and surrounding a light emitting area in which the light emitting elements are arranged.

The second bank may surround a sub-area that is spaced apart from the light emitting area and may not include the light emitting elements, and the first insulating layer may cover the first electrode, the second electrode and the first banks in the light emitting area.

The first insulating layer may include a first contact portion exposing a part of an upper surface of the first electrode in the sub-area, and a second contact portion exposing a part of an upper surface of the second electrode in the sub-area, and the display device may further include a first contact electrode disposed on the first electrode and contacting an end of one of the light emitting elements and the first electrode exposed through the first contact portion, and a second contact electrode disposed on the second electrode and contacting another end of the one of the light emitting elements and the second electrode exposed through the second contact portion.

According to an embodiment of the disclosure, a display device may include sub-pixels including a light emitting area and arranged in a direction, first banks disposed over the sub-pixels neighboring in the direction and spaced apart from each other in the direction in the light emitting area, a first electrode and a second electrode disposed on the first banks in the light emitting area of the sub-pixel and spaced apart from each other in the direction, a first insulating layer disposed on the first electrode and the second electrode, and light emitting elements disposed on the first insulating layer and each having ends on the first electrode and the second electrode. Each of the first banks may include a first pattern portion including concave portions and convex portions. The first pattern portions of the first banks may be disposed on side surfaces of the first banks, the included side surfaces being spaced apart and facing each other, and the first pattern portion has a pattern height of half or more of a wavelength of light emitted from one of the light emitting elements, the pattern heigh being defined as a vertical distance between an imaginary extension line connecting lowermost ends of the concave portions and an imaginary extension line connecting uppermost ends of the convex portions.

The sub-pixels may include a first sub-pixel in which first light emitting elements emitting light of a first color are arranged, and a second sub-pixel in which second light emitting elements emitting light of a second color different from the first color are arranged, and the first pattern portion in the first sub-pixel may have a pattern height of half or more of a wavelength of the light of the second color.

The pattern height of the first pattern portion in the first sub-pixel may be half or more of a wavelength of the light of the first color.

The sub-pixels may further include a third sub-pixel in which third light emitting elements emitting light of a third color different from the first color and the second color are arranged, and the first pattern portion in the first sub-pixel, the second sub-pixel, and the third sub-pixel may have a pattern height of half or more of a wavelength of the light of the third color.

The pattern height of the first pattern portion in the first sub-pixel, the second sub-pixel, and the third sub-pixel may be about 390 nm or more.

Each of the first electrode and the second electrode may include a second pattern portion disposed on the first pattern portion and having a pattern shape corresponding to the first pattern portion on a surface of the second pattern portion, and the first insulating layer may include a third pattern portion disposed on the second pattern portion of each of the first electrode and the second electrode and having a pattern shape corresponding to the second pattern portion on a surface of the third pattern portion.

The display device may further comprise a first contact electrode disposed on the first electrode and contacting the first electrode and an end of one of the light emitting elements, and a second contact electrode disposed on the second electrode and contacting the second electrode and another end of the one of the light emitting elements. Each of the first contact electrode and the second contact electrode may include a fourth pattern portion disposed on the third pattern portion and having a pattern shape corresponding to the third pattern portion on a surface of the fourth pattern portion, and the first insulating layer may have a smaller refractive index than each of a refractive index of the first contact electrode and a refractive index of the second contact electrode.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
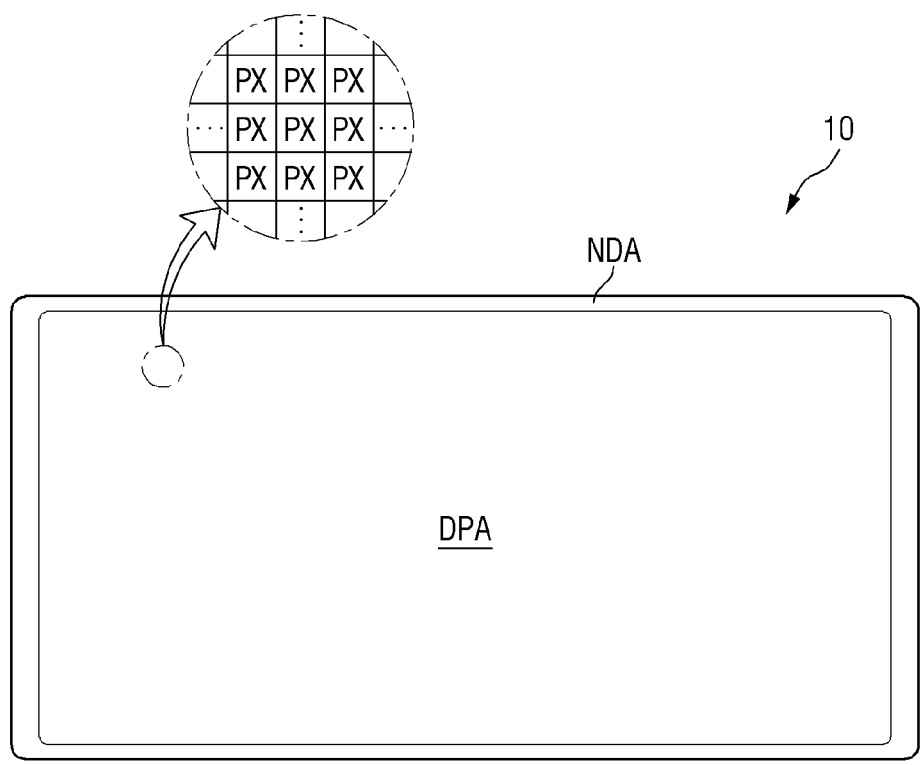
FIG. 1 is a schematic plan view of a display device according to an embodiment.

The disclosure will now be described more fully hereinafter with reference to the accompanying drawings, in which embodiments of the disclosure are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

As used herein, the singular forms, "a," "an," and "the" are intended to include the plural forms as well (and vice versa), unless the context clearly indicates otherwise.

It will also be understood that when a layer is referred to as being "on" another layer or substrate, it can be directly on the other layer or substrate, or intervening layers may also be present. The same reference numbers indicate the same components throughout the specification. Also, it will be understood that the terms "connected to" or "coupled to" may include a physical or electrical connection or coupling.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element. The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

In the specification and the claims, the phrase "at least one of" is intended to include the meaning of "at least one selected from the group of" for the purpose of its meaning and interpretation. For example, "at least one of A and B" may be understood to mean "A, B, or A and B."

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

"About", "approximately", and "substantially", as used herein, are inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a schematic plan view of a display device according to an embodiment.

Referring to FIG. 1, a display device 10 may display a mobile image or a still image. The display device 10 may refer to any electronic device that provides a display screen. For example, the display device 10 may be used in televisions, notebooks, monitors, billboards, internet of things, mobile phones, smart phones, tablet personal computers (PCs), electronic watches, smart watches, watch phones, head mounted displays, mobile communication terminals, electronic notebooks, electronic books, portable multimedia players (PMPs), navigators, game machines, digital cameras, camcorder, and the like.

The display device 10 may include a display panel for providing a display screen. Examples of the display panel may include an inorganic light emitting diode display panel, an organic light emitting display panel, a quantum dot light emitting display panel, a plasma display panel, and a field emission display panel. Hereinafter, there will be given as an example, a case where an inorganic light emitting diode display panel is used as the display panel, but the disclosure is not limited thereto. Any display panel may be used as the display panel as long as similar technical ideas are applicable.

The shape of the display device 10 may be modified. For example, the display device 10 may have a shape such as a rectangle having longer horizontal sides, a rectangle having longer vertical sides, a square, a rectangle having round corners (vertexes), a polygon, or a circle. The shape of a display area DPA of the display device 10 may be similar to the overall shape of the display device 10. FIG. 1 illustrates a display device 10 having a rectangular shape having longer sides in the second direction DR2.

The display device 10 may include a display area DPA and a non-display area NDA. The display area DPA may be an area where an image is displayed, and the non-display area NDA may be an area where an image may not be displayed. The display area DPA may be referred to as an active area, and the non-display area NDA may be referred to as an inactive area. The display area DPA may generally occupy the center of the display device 10.

The display area DPA may include pixels PX. The pixels PX may be arranged in a matrix direction. Each of the pixels PX may have a rectangular shape or a square shape in a plan view, but the shape thereof is not limited thereto. Each of the pixels PX may have a rhombus shape in which each side is inclined with respect to a direction. The respective pixels PX may be alternately arranged in a stripe type or a PENTILE™ type. Each of the pixels PX may include at least one light emitting element emitting light of a specific wavelength band to display a specific color.

The non-display area NDA may be disposed adjacent to (e.g., around) the display area DPA. The non-display area NDA may entirely or partially surround the display area DPA. The display area DPA may have a rectangular shape, and the non-display area NDA may be disposed adjacent to four sides of the display area DPA. The non-display area NDA may constitute a bezel of the display device 10. Lines or circuit drivers included in the display device 10 may be disposed in the non-display area NDA, or external devices may be mounted in the non-display area NDA.

Figure 2:
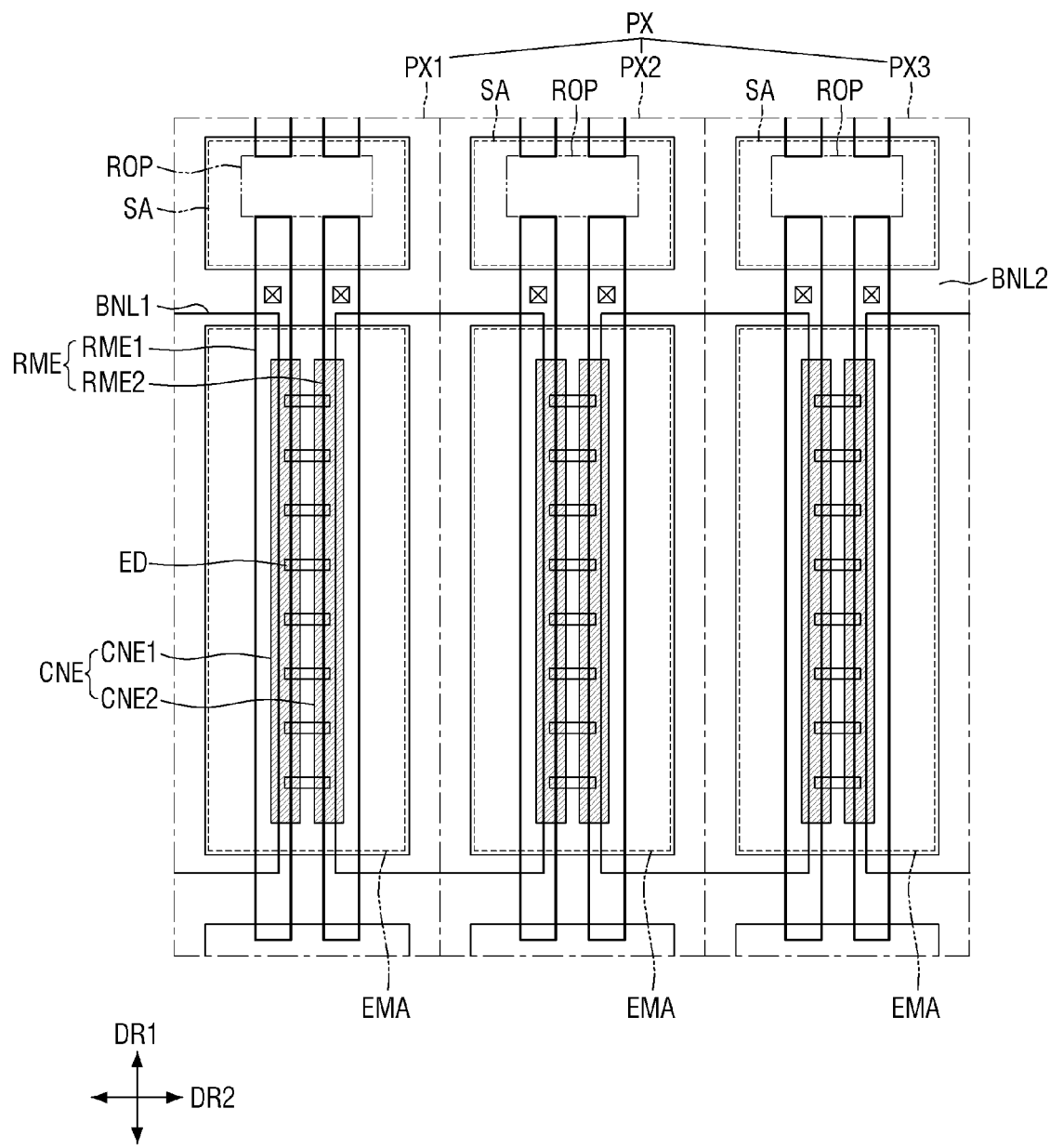
FIG. 2 is a schematic plan view illustrating a pixel of a display device according to an embodiment.

FIG. 2 is a schematic plan view illustrating a pixel of a display device according to an embodiment.

Referring to FIG. 2, each of the pixels PX of the display device 10 may include sub-pixels PXn (n may be an integer of 1 to 3). For example, a pixel PX may include a first sub-pixel PX1, a second sub-pixel PX2, and a third sub-pixel PX3. The first sub-pixel PX1 may emit light of a first color, the second sub-pixel PX2 may emit light of a second color, and the third sub-pixel PX3 may emit light of a third color. For example, the first color may be blue, the second color may be green, and the third color may be red. However, the disclosure is not limited thereto, and each of the sub-pixels PXn may emit light of the same color. Although it is shown in FIG. 2 that a pixel PX includes three sub-pixels PXn, the disclosure is not limited thereto, and the pixel PX may include a larger number of sub-pixels PXn.

Each of the sub-pixels PXn of the display device 10 may include a light emitting area EMA and a non-light emitting area. The light emitting area EMA is defined as an area in which a light emitting element ED may be disposed to emit light of a specific wavelength band, and the non-light emitting area is defined as an area in which no light emitting element ED may be disposed and no light may be emitted. The light emitting area EMA may include an area adjacent to the light emitting element ED to which light emitted from the light emitting element ED may be discharged, in addition to an area in which the light emitting element ED may be disposed.

However, the disclosure is not limited thereto, and the light emitting area may also include an area in which light emitted from the light emitting element ED may be reflected or refracted by another member and emitted. The light emitting elements ED may be arranged in each of the sub-pixels PXn, and the light emitting area may be formed by an area in which the light emitting elements ED are arranged and an area adjacent to this area.

Although it is illustrated in the drawings that the light emitting areas EMA of each of the sub-pixels PXn have substantially uniform areas, the disclosure is not limited thereto. In some embodiments, the light emitting areas EMA of each of the sub-pixels PXn may have different areas depending on the color or wavelength band of light emitted from the light emitting element ED disposed in the corresponding sub-pixel.

Each sub-pixel PXn may further include a sub-area SA disposed in the non-light emitting area. The sub-area SA may be disposed on one side of the light emitting area EMA in the first direction DR1, and may be disposed between the light emitting areas EMA of the sub-pixels PXn neighboring in the first direction DR1. For example, the light emitting areas EMA and the sub-areas SA may be repeatedly arranged in the second direction DR2, respectively, but may be alternately arranged in the first direction DR1. A second bank BNL2 may be disposed between the sub-areas SA and the light emitting areas EMA, and the interval between the sub-areas SA may vary according to the width of the second bank BNL2. The light emitting element ED may not be disposed in the sub-area SA, but a part of the electrode RME disposed in each sub-pixel PXn may be disposed in the sub-area SA. The electrodes RMEs disposed in different sub-pixels PXn may be disposed to be separated from each other in the sub-area SA.

The second bank BNL2 may include portions extending in the first direction DR1 and the second direction DR2 in a plan view to be disposed in a grid pattern over the display area DPA. The second bank BNL2 may be disposed across the boundary of each sub-pixel PXn to distinguish neighboring sub-pixels PXn. Further, the second bank BNL2 may be disposed so as to surround the light emitting areas EMA disposed for each sub-pixel PXn to distinguish the light emitting areas EMA.

Figure 3:
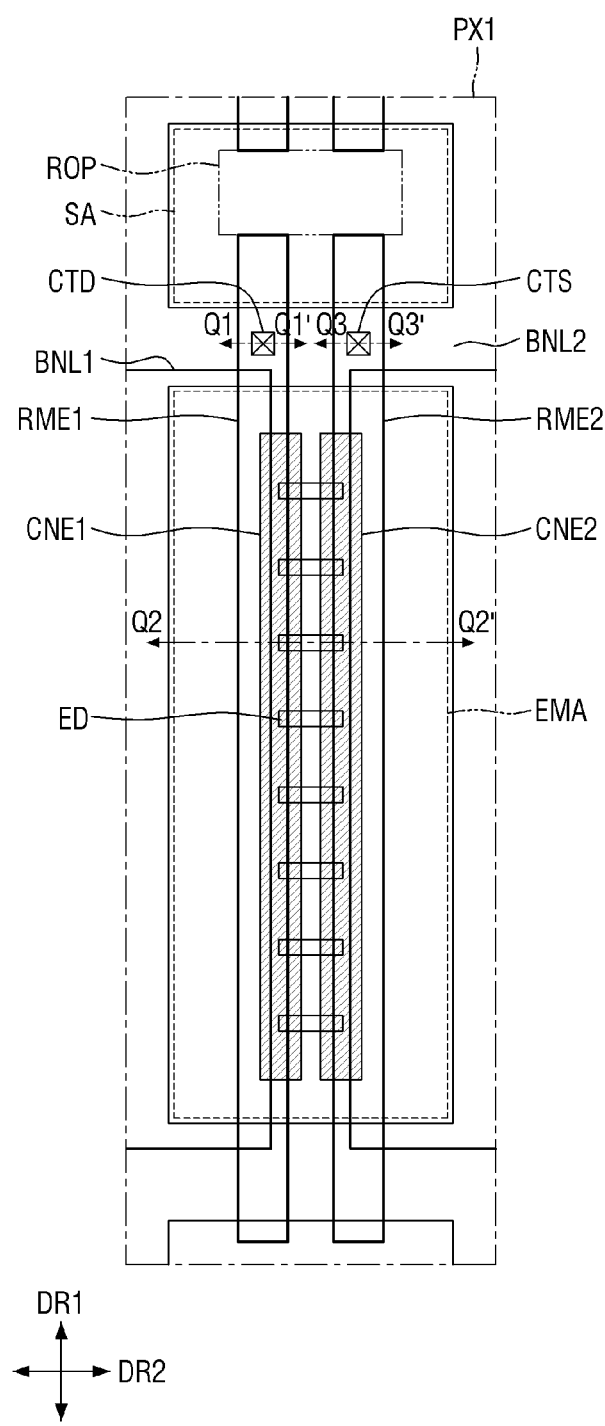
FIG. 3 is a schematic plan view illustrating the first sub-pixel of FIG. 2.
Figure 4:
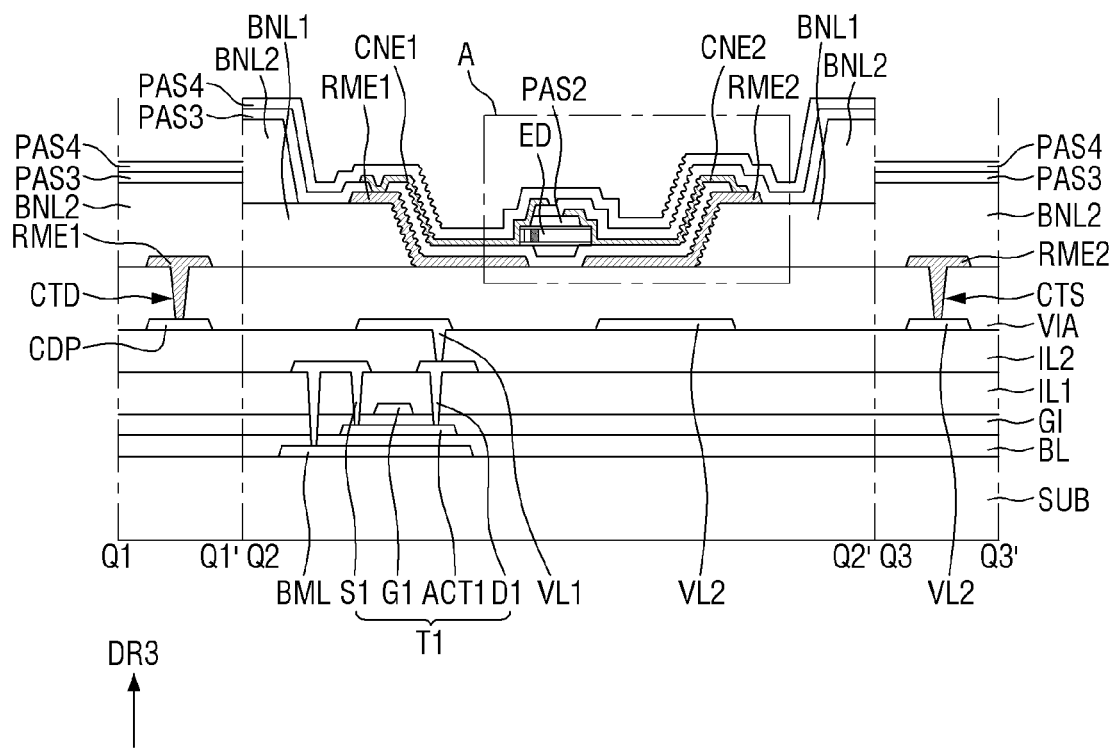
FIG. 4 is a schematic cross-sectional view taken along lines Q1-Q1', Q2-Q2', and Q3-Q3' of FIG. 3.

FIG. 3 is a schematic plan view illustrating the first sub-pixel of FIG. 2. FIG. 4 is a schematic cross-sectional view taken along lines Q1-Q1', Q2-Q2', and Q3-Q3' of FIG. 3. FIG. 3 illustrates the first sub-pixel PX1 included in a pixel PX, and FIG. 4 illustrates a cross section across both ends of different light emitting elements ED disposed in the first sub-pixel PX1.

Referring to FIGS. 3 and 4 together with FIG. 2, the display device 10 may include a substrate SUB and a semiconductor layer, conductive layers, and insulating layers, which may be disposed on the substrate SUB. The semiconductor layer, the conductive layers, and the insulating layers may constitute a circuit layer CCL and a display element layer of the display device 10, respectively.

The substrate SUB may be an insulating substrate. The substrate SUB may be made of an insulating material such as glass, quartz, polymer resin, or a combination thereof. The substrate SUB may be a rigid substrate, but may also be a flexible substrate capable of bending, folding, rolling, or the like.

A first conductive layer may be disposed on the substrate SUB. The first conductive layer may include a lower metal layer BML, and the lower metal layer BML may be disposed to overlap an active layer ACT1 of a first transistor T1. The lower metal layer BML may include a material blocking light, thereby preventing light from entering the active layer ACT1 of the first transistor T1. However, the lower metal layer BML may be omitted.

A buffer layer BL may be disposed on the lower metal layer BML and the substrate SUB. The buffer layer BL may be formed on the substrate SUB to protect the transistors of the pixel PX from moisture penetrating through the substrate SUB which may be vulnerable to moisture permeation, and may perform a surface planarization function.

A semiconductor layer may be disposed on the buffer layer BL. The semiconductor layer may include an active layer ACT1 of the first transistor T1. The active layer ACT1 may be disposed to at least partially overlap a gate electrode G1 of a second conductive layer to be described later.

The semiconductor layer may include at least one of polycrystalline silicon, monocrystalline silicon, and oxide semiconductor. In another embodiment, the semiconductor layer may include polycrystalline silicon. The oxide semiconductor may be an oxide semiconductor containing indium (In). For example, the oxide semiconductor may be any of indium-tin oxide (ITO), indium-zinc oxide (IZO), indium-gallium oxide (IGO), indium-zinc-tin oxide (IZTO), indium-gallium-tin oxide (IGTO), indium-gallium-zinc oxide (IGZO), and indium-gallium-zinc-tin oxide (IGZTO).

Although it is illustrated in the drawings that one first transistor T1 is disposed in the sub-pixel PXn of the display device 10, the disclosure is not limited thereto, and the display device 10 may include a larger number of transistors.

A first gate insulating layer GI may be disposed on the semiconductor layer and the buffer layer BL. The first gate insulating layer GI may function as a gate insulating film of the first transistor T1.

A second conductive layer may be disposed on the first gate insulating layer GI. The second conductive layer may include a gate electrode G1 of the first transistor T1. The gate electrode G1 may be disposed to overlap the channel region of the active layer ACT1 in the third direction DR3, which may be a thickness direction. Although not shown in the drawings, the second conductive layer may further include a capacitance electrode of a storage capacitor.

A first interlayer insulating layer IL1 may be disposed on the second conductive layer. The first interlayer insulating layer IL1 may function as an insulating film between the second conductive layer and other layers disposed thereon, and may protect the second conductive layer.

A third conductive layer may be disposed on the first interlayer insulating layer IL1. The third conductive layer may include a first source electrode S1 and first drain electrode D1 of the first transistor T1.

The first source electrode S1 and first drain electrode D1 of the first transistor T1 may contact the active layer ACT1 through a contact hole penetrating the first interlayer insulating layer IL1 and the first gate insulating layer GI, respectively. Further, the first source electrode S1 of the first transistor T1 may contact the lower metal layer BML through another contact hole. Although not shown in the drawings, the third conductive layer may further include data lines or a capacitance electrode of a storage capacitor.

A second interlayer insulating layer IL2 may be disposed on the third conductive layer. The second interlayer insulating layer IL2 may function as an insulating film between the third conductive layer and other layers disposed thereon and may protect the third conductive layer.

A fourth conductive layer may be disposed on the second interlayer insulating layer IL2. The fourth conductive layer may include a first voltage line VL1, a second voltage line VL2, and a first conductive pattern CDP. A high-potential voltage (or a first power voltage) transmitted to a first electrode RME1 through the first transistor T1 may be applied to first voltage line VL1, and a low-potential voltage (or a second power voltage) transmitted to a second electrode RME2 may be applied to the second voltage line VL2.

The first conductive pattern CDP may be electrically connected to the first transistor T1. The first conductive pattern CDP may be connected to the first electrode RME1 to be described later, and the first transistor T1 may transmit a first power voltage applied from the first voltage line VL1 to the first electrode RME1.

Each of the buffer layer BL, the first gate insulating layer GI, the first interlayer insulating layer IL1 and the second interlayer insulating layer IL2 may be formed of multiple inorganic layers alternately stacked. For example, each of the buffer layer BL, the first gate insulating layer GI, the first interlayer insulating layer IL1, and the second interlayer insulating layer IL2 may be formed as double layers in which inorganic layers each including at least one of silicon oxide (SiOx), silicon nitride (SiNx), and silicon oxynitride (SiOxNy), or as multiple layers in which these inorganic layers are alternately stacked. However, the disclosure is not limited thereto, and each of the buffer layer BL, the first gate insulating layer GI, the first interlayer insulating layer IL1 and the second interlayer insulating layer IL2 may also be formed of one inorganic layer including the above-described insulating material. Further, in some embodiments, each of the first interlayer insulating layer IL1 and the second interlayer insulating layer IL2 may be made of an organic insulating material such as polyimide (PI).

Each of the second conductive layer, the third conductive layer, and the fourth conductive layer may be formed as a single layer or multiple layers including any of molybdenum (Mo), aluminum (Al), chromium (Cr), gold (Au), titanium (Ti), nickel (Ni), neodymium (Nd), and copper (Cu), or an alloy thereof. However, the disclosure is not limited thereto.

A via layer VIA may be disposed on the fourth conductive layer. The via layer VIA may include an organic insulating material such as polyimide (PI), and may perform a surface planarization function.

Electrodes (RME: RME1, RME2), first banks BNL1, a second bank BNL2, light emitting elements ED, and contact electrodes (CNE; CNE1, CNE2) are arranged on the via layer VIA, as a display element layer. Further, insulating layers PAS1 and PAS2 may be disposed on the via layer VIA.

The first banks BNL1 may be directly disposed on the via layer VIA. The first banks BNL1 may have a shape extending in the first direction DR1 and may be disposed over other sub-pixels PXn neighboring in the second direction DR2. A first bank BNL1 may be disposed over the sub-pixels PXn, and may be spaced apart from another first bank BNL1 in the second direction DR2 within the light emitting area EMA. For example, the first bank BNL1 may be formed to have a width in the first direction DR1 and the second direction DR2, a part of the first bank BNL1 may be disposed in the light emitting area EMA, and the other part thereof may be disposed at the boundary of the sub-pixel PXn neighboring in the second direction DR2. Each of the first banks BNL1 may be formed to have a length measured in the first direction DR1 that may be greater than the length of the light emitting area EMA measured in the first direction DR1, so that a part of the first bank BNL1 may be disposed to overlap the second bank BNL2 in the non-light emitting area.

Different first banks BNL1 may be disposed to be spaced apart from each other in a sub-pixel PXn, and light emitting elements ED may be disposed between the first banks BNL1. Although it is illustrated in the drawings that two first banks BNL1 are disposed in the light emitting area EMA of each sub-pixel PXn to form an island-like pattern, the disclosure is not limited thereto. The number of first banks BNL1 disposed in the light emitting area EMA of each sub-pixel PXn may vary depending on the number of electrodes RME1 and RME2 or the arrangement of the light emitting elements ED.

The first bank BNL1 may have a structure in which at least a part thereof protrudes from the upper surface of the via layer VIA. The protruding portion of the first bank BNL1 may have an side surface, and the light emitted from the light emitting element ED may be reflected from the electrode RME disposed on the first bank BNL1 and emitted in the upward direction of the via layer VIA. However, the disclosure is not limited thereto, and the first bank BNL1 may have a curved semi-circle or semi-ellipse shape. The first bank BNL1 may include an organic insulating material such as polyimide (PI), but the material thereof is not limited thereto.

According to an embodiment, the first banks BNL1 of the display device 10 may include a first pattern portion ("GP1" in FIG. 5) including multiple concave portions and convex portions on inclined side surfaces that are spaced apart from each other and face each other. The concave portions and convex portions of a first pattern portion GP1 may be formed to have curved outer surfaces and may be alternately repeated with each other. The first bank BNL1 may include the first pattern portion GP1 to have a curved shape in which the inclined side surface is not linear. As will be described later, electrodes RME1 and RME2, contact electrodes CNE1 and CNE2, and insulating layers PAS1, PAS2, PAS3, and PAS4 may be sequentially arranged on the first pattern portion GP1 of the first bank BNL1, and these layers may include pattern portions ('GP2', 'GP3','GP4', and 'GP5' in FIG. 5) including multiple concave portions and convex portions corresponding to the first pattern portion GP1 of the first bank BNL1, respectively. The pattern portions of the layers disposed on the first pattern portion GP1 of the first bank BNL1, together with the first pattern portion GP1 of the first bank BNL1, may have an effect of scattering light emitted from the light emitting element ED. Light directed toward the side surface of the first bank BNL1 may be reflected or refracted in various directions by the concave portions and convex portions included in the pattern portion disposed thereon, and may be scattered in various directions, and not in a specific direction. Accordingly, in the display device 10, the light emission efficiency and side luminance of the light may be improved. The first pattern portion GP1 formed on the side surface of the first bank BNL1 and the multiple pattern portions disposed on the first pattern portion GP1 will be described later with reference to other drawings.

The electrodes RME may have a shape extending in a direction and may be arranged for each sub-pixel PXn. The electrodes RME may have a shape extending in the first direction DR1 and may be disposed to be spaced apart from each other in the second direction DR2 within each sub-pixel PXn.

For example, a sub-pixel PXn may include a first electrode RME1 and a second electrode RME2 extending in the first direction DR1 and disposed over the light emitting area EMA and the sub-area SA. The electrodes RME of the sub-pixel PXn neighboring in the first direction DR1 may be separated from each other in a separation portion ROP of the sub-area SA. The first electrode RME1 and the second electrode RME2 may be formed as electrode lines extending in the first direction DR1 in a process of manufacturing the display device 10, and may be used to generate an electric field in the sub-pixel PXn in order to align the light emitting element ED. The light emitting element ED may be aligned by receiving a dielectrophoretic force by the electric field generated on the electrode line, and the electrode line may be separated from the separation portion ROP to form the respective electrodes RME.

In the drawing, a structure in which the electrodes RME are spaced apart from each other in the separation portion ROP of the sub-area SA is illustrated, but the structure is not limited thereto. In some embodiments, the electrodes RME disposed in each sub-pixel PXn may be spaced apart from each other in the separation portion ROP formed in the light emitting area EMA. The electrodes RME may be divided into one electrode group located at one side of the separation portion ROP and another electrode group located at the other side of the separation portion ROP, based on the separation portion ROP of the light emitting area EMA.

The first electrode RME1 may be disposed on the first bank BNL1 located at the left side of the light emitting area EMA. The second electrode RME2 may be spaced apart from the first electrode RME1 in the second direction DR2 and may be disposed on the first bank BNL1 disposed at the right side of the light emitting area EMA.

Each of the electrodes RME1 and RME2 may be disposed on one side of the first bank BNL1 in the second direction DR2 and may be disposed on the inclined side surface of the first bank BNL1. In an embodiment, the width of each of the electrodes RME1 and RME2 measured in the second direction DR2 may be smaller than the width of the first bank BNL1 measured in the second direction DR2. Each of the electrodes RME1 and RME2 may be disposed to cover at least one side surface of the first bank BNL1 to reflect light emitted from the light emitting element ED. The distance between the electrodes RMEs in the second direction DR2 may be narrower than the distance between the first banks BNL1. Each of the electrodes RME may have at least some regions directly disposed on the via layer VIA, so that they may be disposed on the same plane.

Each of the first electrode RME1 and the second electrode RME2 may be connected to the underlying fourth conductive layer.

Each of the first electrode RME1 and the second electrode RME2 may be directly connected to the fourth conductive layer through a first electrode contact hole CTD and a second electrode contact hole CTS formed in the portion overlapping the second bank BNL2. For example, the first electrode RME1 may contact the first conductive pattern CDP through the first electrode contact hole CTD penetrating the via layer VIA under the first electrode RME1. The second electrode RME2 may contact the second voltage line VL2 through the second electrode contact hole CTS penetrating the via layer VIA under the second electrode RME2. The first electrode RME1 may be electrically connected to the first transistor T1 through the first conductive pattern CDP to apply a first power voltage, and the second electrode RME2 may be electrically connected to the second voltage line VL2 to apply a second power voltage. Since the first electrode RME1 and the second electrode RME2 may be disposed separately for each sub-pixel PXn, the light emitting elements ED of different sub-pixels PXn may emit light individually.

The electrodes RME may be electrically connected to the light emitting element ED. For example, each electrode RME may be connected to the light emitting element ED through a contact electrode CNE; CNE1 or CNE2, which will be described later, and may transmit an electric signal applied from the fourth conductive layer to the light emitting element ED. Electric signals for allowing the light emitting elements ED to emit light may be directly applied to each of the electrodes RME. In an embodiment further including electrodes other than the first electrode RME1 and the second electrode RME2, the electric signals may be transmitted to other electrodes through the contact electrode CNE and the light emitting elements ED.

Each of the electrodes RME may include a conductive material having high reflectance. For example, each electrode RME may include a metal such as silver (Ag), copper (Cu), aluminum (Al), or a combination thereof as the conductive material having high reflectance, or may include an alloy including at least one of aluminum (Al), nickel (Ni), and lanthanum (La). Each electrode RME may reflect the light emitted from the light emitting element ED and proceeding to the side surface of the second bank BNL2 in the upward direction of each sub-pixel PXn.

However, the disclosure is not limited thereto, and each electrode RME may further include a transparent conductive material. For example, each electrode RME may include a material such as indium tin oxide (ITO), indium zinc oxide (IZO), indium tin zinc Oxide (ITZO), or a combination thereof. In some embodiments, each of the electrodes RME may have a structure in which one or more transparent conductive material layers and one or more metal layers having high reflectivity are stacked, or may be formed as one layer including the layers. For example, each electrode RME may have a stacked structure of ITO/Ag/ITO/, ITO/Ag/IZO, or ITO/Ag/ITZO/IZO.

The first insulating layer PAS1 is disposed on the via layer VIA and the electrodes RME. The first insulating layer PAS1 may be disposed to partially cover the electrodes RME, and may be disposed to protect the electrodes RME and insulate the electrodes RME from each other. The first insulating layer PAS1 may prevent the light emitting element ED disposed thereon from being damaged by direct contact with other members.

In an embodiment, a step may be formed in the first insulating layer PAS1 such that a part of the upper surface of the first insulating layer PAS1 is depressed between the electrodes RME spaced apart from each other in the second direction DR2. The light emitting element ED may be disposed on the upper surface of the first insulating layer PAS1 on which the step is formed, and a space may be formed between the light emitting element ED and the first insulating layer PAS1.

The first insulating layer PAS1 may be disposed to expose a part of the upper surface of each of the electrodes RME. For example, the first insulating layer PAS1 may cover a region between the first banks BNL1 and a portion disposed on the inclined side surface of the first banks BNL1 among the electrodes RME1 and RME2. The contact electrodes CNE, which will be described later, may contact the electrode RME through portions exposed by the first insulating layer PAS1 of the electrodes RME. However, the disclosure is not limited thereto, and in some embodiments, the first insulating layer PAS1 may be disposed to have a structure having contact portions ('CT1' and 'CT2' in FIG. 22) entirely covering the electrodes RME1 and RME2 on the via layer VIA and the first banks BNL1 and exposing a part of the upper surface of the first insulating layer PAS1.

The second bank BNL2 may be disposed on the first bank BNL1. The second bank BNL2 may include portions extending in the first direction DR1 and the second direction DR2 in a plan view to be disposed in a grid pattern, and may be disposed across the boundary of each sub-pixel PXn to distinguish neighboring sub-pixels PXn.

The second bank BNL2 may have a height. In some embodiments, the height of the upper surface of the second bank BNL2 may be higher than that of the first bank BNL1, and the thickness of the second bank BNL2 may be equal to or greater than that of the first bank BNL1. As one first bank BNL1 may be disposed over the sub-pixels PXn neighboring in the first direction DR1, a part of the portion of the second bank BNL2 extending in the second direction DR2 may be disposed on the first bank BNL1. The second bank BNL2 may prevent ink from overflowing to adjacent sub-pixels PXn in an inkjet printing process of a process of manufacturing the display device 10. The second bank BNL2 may prevent inks in which different light emitting elements ED may be dispersed for each pixel PXn from being mixed with each other. The second bank BNL2, like the first bank BNL1, may include polyimide (PI), but the material thereof is not limited thereto.

The light emitting elements ED may be arranged on the first insulating layer PAS1. The light emitting element ED may include layers arranged in a direction parallel to the upper surface of the substrate SUB. In the display device 10, the light emitting element ED is disposed such that one extending direction thereof may be parallel to the substrate SUB, and the semiconductor layers included in the light emitting element ED may be sequentially arranged along a direction parallel to the upper surface of the substrate SUB. However, the disclosure is not limited thereto. In some cases, in case that the light emitting element ED has a different structure, the layers may be arranged in a direction perpendicular to the substrate SUB.

The light emitting elements ED may be arranged to be spaced apart from each other along the first direction DR1 in which the electrodes RMEs may extend, and may be substantially aligned in parallel with each other. The light emitting element ED may have a shape extending in one direction, and a direction in which each of the electrodes RME extends may be substantially perpendicular to a direction in which the light emitting element ED extends. However, the disclosure is not limited thereto, and the light emitting element ED may be disposed obliquely in a direction in which each of the electrodes RME extends.

The light emitting element ED may include semiconductor layers and may be in contact with contact electrodes CNE1 and CNE2 to be described later. In the light emitting element ED, an insulating film ("38" in FIG. 8) may not be formed on the end surface of the light emitting element ED extending in one direction, and a part of the semiconductor layer may be exposed, so that the exposed semiconductor layer may be in contact with the contact electrode CNE. Further, in the display device 10 according to an embodiment, a part of the insulating layer 38 located on the side surface of the light emitting element ED may be removed, and a part of the contact electrode CNE may be connected to the side surface of the light emitting element ED. Each of the light emitting elements ED may be electrically connected to the first electrode RME1 or the conductive layers under the via layer VIA through the contact electrodes CNE, and may emit light of a specific wavelength band by applying an electric signal.

The light emitting elements ED arranged in each sub-pixel PXn may emit light of different wavelength bands according to the material constituting the semiconductor layer. However, the disclosure is not limited thereto, and the light emitting elements ED arranged in each sub-pixel PXn may emit light of the same color. The light emitting element ED may include semiconductor layers doped with different conductivity types of dopants, and may be aligned such that one end of the light emitting element ED faces a specific direction according to the direction of an electric field generated on the electrode RME.

The light emitting element ED may have an extended length longer than the distance between the first electrode RME1 and the second electrode RME2, and ends thereof may be placed on the first electrode RME1 and the second electrode RME2, respectively. The light emitting elements ED may include semiconductor layers, and a first end and a second end opposite to the first end may be defined based on any one of the semiconductor layers. The light emitting element ED may be disposed such that the first end and the second end are placed on the first electrode RME1 and the second electrode RME2, respectively. However, the disclosure is not limited thereto, and some of the light emitting elements ED may be disposed such that only one end is placed on the electrodes RME1 and RME2 according to the direction oriented between the first electrode RME1 and the second electrode RME2.

A second insulating layer PAS2 may be disposed on the light emitting elements ED. For example, the second insulating layer PAS2 may be disposed to partially surround the outer surface of the light emitting element ED not to cover one end and the other end of the light emitting element ED. A portion of the second insulating layer PAS2, the portion being disposed on the light emitting element ED, may be disposed to extend in the first direction DR1 on the first insulating layer PAS1 in a plan view, thereby forming a linear or island-shaped pattern in each sub-pixel PXn. The second insulating layer PAS2 may protect the light emitting element ED and fix the light emitting element ED in the process of manufacturing the display device 10. Further, the second insulating layer PAS2 may be disposed to fill the space between the light emitting element ED and the first insulating layer PAS1 under the light emitting element ED.

The contact electrodes CNE may be arranged on the light emitting elements ED and the second insulating layer PAS2. The contact electrode CNE may be disposed on each of the electrodes RME1 and RME2 to contact an end of the light emitting element ED and any one of the electrodes RME.

For example, the contact electrodes CNE may extend in the first direction DR1 and may be disposed in the light emitting area EMA. The first contact electrode CNE1 may be disposed on the first electrode RME1 and extend in the first direction DR1, and the second contact electrode CNE2 may be disposed on the second electrode RME2 and extend in the first direction DR1. The first contact electrode CNE1 and the second contact electrode CNE2 may be spaced apart from each other in the second direction DR2 on the light emitting element ED in a plan view. The first contact electrode CNE1 may be in contact with the first electrode RME1 and the first end of the light emitting element ED, and the second contact electrode CNE2 may be in contact with the second electrode RME2 and the second end of the light emitting element ED. The light emitting elements ED may receive electrical signals applied to the electrode RME through the first contact electrode CNE1 and the second contact electrode CNE2 to emit light of a specific wavelength band.

The contact electrodes CNE may include a conductive material. For example, the contact electrodes CNE may include ITO, IZO, ITZO, aluminum (Al), or a combination thereof. For example, the contact electrode CNE may include a transparent conductive material, and light emitted from the light emitting element ED may pass through the contact electrode CNE and travel toward the electrodes RME. However, the disclosure is not limited thereto.

A third insulating layer PAS3 may be disposed between the first contact electrode CNE1 and the second contact electrode CNE2. The second contact electrode CNE2 may be directly disposed on the second insulating layer PAS2, and the third insulating layer PAS3 may be disposed to cover the second insulating layer PAS2 and the second contact electrode CNE2. The third insulating layer PAS3 may be disposed on the second contact electrode CNE2 and may be entirely disposed on the via layer VIA except for an area in which the first contact electrode CNE1 is disposed. For example, the third insulating layer PAS3 may be disposed on the first bank BNL1 and the second bank BNL2 in addition to the first insulating layer PAS1 and the second insulating layer PAS2. The third insulating layer PAS3 may insulate the first contact electrode CNE1 and the second contact electrode CNE2 from each other so as to prevent the first and second contact electrodes CNE1 and CNE 2 from directly contacting each other.

A fourth insulating layer PAS4 may be disposed on the first contact electrode CNE1 and the third insulating layer PAS3. The fourth insulating layer PAS4 may be substantially entirely disposed on the via layer VIA, and may function to protect the members disposed on the substrate SUB from an external environment.

Each of the first insulating layer PAS1, the second insulating layer PAS2, the third insulating layer PAS3, and the fourth insulating layer PAS4, described above, may include an inorganic insulating material or an organic insulating material. However, the disclosure is not limited thereto.

In the display device 10 according to an embodiment, the layers disposed on the via layer VIA may include a pattern portion including multiple concave portions and convex portions. The pattern portions included in the layers may be formed by the first pattern portion GP1 disposed on the side surface of the first bank BNL1 and may scatter light emitted from the light emitting element ED.

Figure 5:
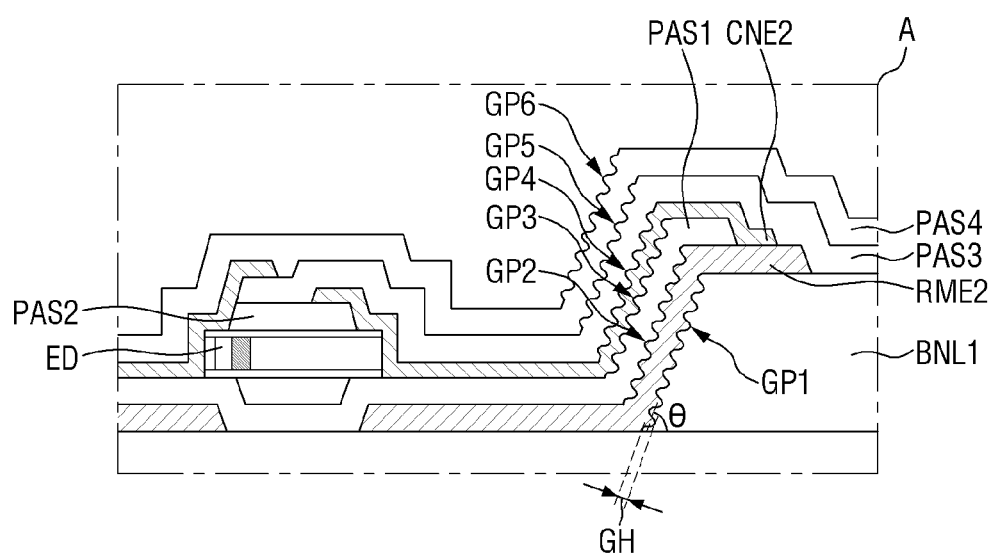
FIG. 5 is an enlarged schematic view of portion A in FIG. 4.
Figure 6:
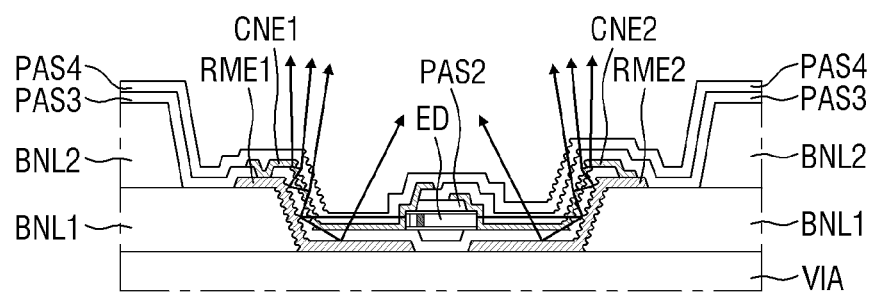
FIG. 6 is a schematic cross-sectional view schematically illustrating a path of light emitted from a light emitting element of a display device according to an embodiment.
Figure 7:
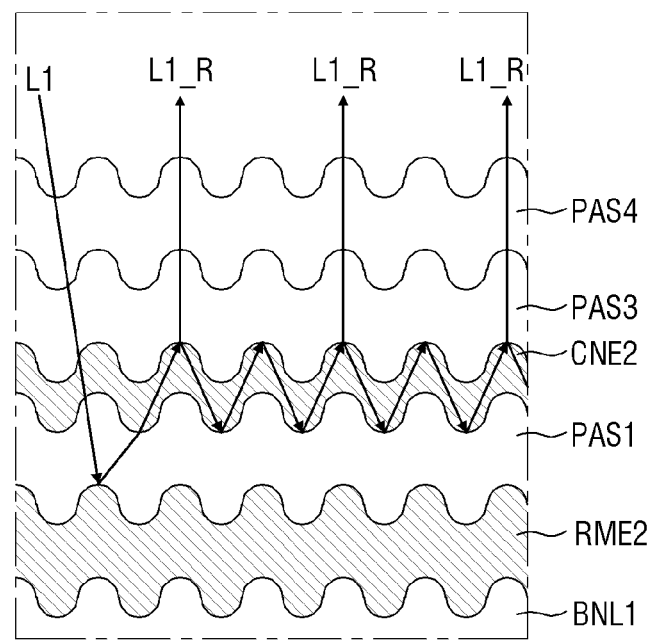
FIG. 7 is a schematic view illustrating the traveling of the light of FIG. 6 in multiple layers.

FIG. 5 is an enlarged schematic view of portion A in FIG. 4. FIG. 6 is a schematic cross-sectional view schematically illustrating a path of light emitted from a light emitting element of a display device according to an embodiment. FIG. 7 is a schematic view illustrating the traveling of the light of FIG. 6 in multiple layers. FIG. 5 illustrates the shapes of the first pattern portion GP1 of the first bank BNL1 and the pattern portions formed on layers disposed on the first pattern portion GP1, and FIGS. 6 and 7 schematically illustrate a case where light emitted from the light emitting element ED is scattered by multiple pattern portions.

Referring to FIGS. 5 to 7 together with FIG. 4, in the display device 10 according to an embodiment, the first bank BNL1 may include a first pattern portion GP1 disposed on the inclined side surface thereof. The first pattern portion GP1 of the first bank BNL1 may include multiple concave portions and convex portions. The concave portion of the first pattern portion GP1 may be a portion recessed toward the lower surface of the first bank BNL1, and the convex portion of the first pattern portion GP1 may be a portion protruding toward a direction opposite to the lower surface of the first bank BNL1 or an upward direction of the inclined side surface thereof. The concave portions and convex portions may be formed on the inclined side surface of the first bank BNL1, and the upper surface of the first bank BNL1, that is, a portion where the second bank BNL2 is disposed, may form a flat surface. The first pattern portions GP1 disposed on side surfaces of the first banks BNL1 facing each other in the second direction DR2 may face each other.

In the first pattern portion GP1, the concave portions and convex portions may be repeatedly arranged alternately with each other. Although it is illustrated in the cross-sectional view that the concave portions and convex portions of the first pattern portion GP1 are alternately arranged along the side surface of the first bank BNL1, the concave portions and convex portions may have a shape extending in a direction the same as the direction in which the inclined side surface of the first bank BNL1 extends. For example, the respective concave portions and convex portions may extend in the first direction DR1 to have a linear shape. The concave portions and the convex portions may be connected and arranged adjacent to each other, and the width of each of the concave portions and the convex portions may be defined as an interval between adjacent concave portions or an interval between adjacent convex portions. According to an embodiment, in the first pattern portion GP1 of the first bank BNL1, the concave portions and convex portions may be formed to have the same width. However, the disclosure is not limited thereto, and the concave portions and convex portions of the first pattern portion GP1 may have different widths and may be irregularly formed.

The electrodes RME1 and RME2 may be disposed on the first bank BNL1, and at least a part thereof may be disposed directly on the first pattern portion GP1. The electrodes RME1 and RME2 may have a thickness and may be disposed on the first pattern portion GP1 of the first bank BNL1. According to an embodiment, the electrodes RME1 and RME2 may include a second pattern portion GP2 that may have a pattern shape corresponding to the first pattern portion GP1 on a surface thereof. "A surface" may refer to a surface opposite to the surface contacting the underlying pattern portion, that is, an upper surface of the corresponding layer. For example, a surface of each of the electrodes RME1 and RME2 may be an upper surface that does not contact the first pattern portion GP1.

The second pattern portion GP2 of the electrodes RME1 and RME2 may be formed by the first pattern portion GP1 disposed on the lower surface thereof, and the second pattern portion GP2 may include multiple concave portions and convex portions that may have the same shape corresponding to the concave portions and convex portions of the first pattern portion GP1. In the electrodes RME1 and RME2, the second pattern portion GP2 may be disposed in a portion of a surface disposed on the side surface of the first bank BNL1, and a portion disposed on the upper surfaces of the via layer VIA and the first bank BNL1 may form a flat surface. The shape of the second pattern portion GP2 formed on a surface of the electrodes RME1 and RME2 may be substantially the same as the first pattern portion GP1 of the first bank BNL1.

Similar to the electrodes RME1 and RME2, the layers disposed on the electrodes RME1 and RME2 may include pattern portions that may have multiple concave portions and convex portions formed by the first pattern portion GP1 of the first bank BNL1 or the second pattern portion GP2 of the electrodes RME1 and RME2. For example, the first insulating layer PAS1 may include third pattern portions GP3 disposed on the second pattern portion GP2 of the electrodes RME1 and RME2 and have a pattern shape corresponding to the second pattern portion GP2 on a surface thereof. The contact electrodes CNE1 and CNE2 may include a fourth pattern portion GP4 disposed on the third pattern portion GP3 of the first insulating layer PAS1 and have a pattern shape corresponding to the third pattern portion GP3 on a surface thereof. The third insulating layer PAS3 may include a fifth pattern portion GP5 disposed on the fourth pattern portion GP4 of the second contact electrode CNE2 and have a pattern shape corresponding to the fourth pattern portion GP4 on a surface thereof. The fourth insulating layer PAS4 may include a sixth pattern portion GP6 disposed on the fifth pattern portion GP5 of the third contact electrode CNE3 and have a pattern shape corresponding to the fifth pattern portion GP5 on a surface thereof.

The second to sixth pattern portions GP2, GP3, GP4, GP5, and GP6 formed on the layers disposed on the first bank BNL1 may have a pattern shape corresponding to the concave portions and convex portions of the first pattern portion GP1 of the first bank BNL1. Each of the layers is formed to have a thickness, and may have a pattern shape formed on a surface corresponding to the step of the lower surface or the shapes of the concave portion and the convex portion. The pattern portions GP2, GP3, GP4, GP5, and GP6 of the layers disposed on the first bank BNL1 may include concave portions and convex portions having the same shape as the concave portions and convex portions of the first pattern portion GP1, and a portion disposed on the inclined side surface of the first bank BNL1 may form a curved outer surface.

On the other hand, the upper surfaces of the via layer VIA and the first bank BNL1 may have flat surfaces because concave portions and convex portions may not be formed on the upper surfaces thereof. Portions disposed on the upper surface of the via layer VIA and the first bank BNL1 among the layers may have flat surfaces such as the upper surfaces of the via layer VIA and the first bank BNL1 disposed thereunder.

Light generated by the light emitting element ED may travel without direction, and a part of the light may be emitted through ends of the light emitting element ED. Since the light emitting elements ED may be disposed between the first banks BNL1, the light emitted from ends of the light emitting element ED may travel toward the inclined side surface of the first bank BNL1. The light may be reflected from the electrodes RME1 and RME2 disposed on the side surface of the first bank BNL1 and travel upward, and the travel path of the reflected light may vary according to the shape of a surface of the electrodes RME1 and RME2 to which the light may be reflected.

The display device 10 according to an embodiment may include multiple pattern portions having a pattern shape corresponding to the first pattern portion GP1 of the first bank BNL1, and thus the light emitted from the light emitting element ED may be reflected in an upward direction and scattered in a lateral direction. For example, the light L1 emitted from the light emitting element ED may be reflected from the second pattern portion GP2 of the electrodes RME1 and RME2 disposed on the first pattern portion GP1 of the first bank BNL1. As the second pattern portion GP2 of the electrodes RME1 and RME2 may have a curved surface including multiple concave portions and multiple convex portions, the direction in which the light emitted from the light emitting element ED may be reflected and traveled may vary.

A part of the light reflected from the second pattern portion GP2 of the electrodes RME1 and RME2 may be reflected to a portion disposed on the via layer VIA of the electrodes RME1 and RME2, the portion having one flat surface. This light may be reflected from the flat surfaces of the electrodes RME1 and RME2 again and may travel upwards of the via layer VIA. In contrast, another part of the light reflected from the second pattern portion GP2 of the electrodes RME1 and RME2 may be reflected toward the third pattern portion GP3 of the first insulating layer PAS1, and the light incident on the third pattern portion GP3 may be refracted by the third pattern portion GP3 and may be incident on the fourth pattern portion GP4 of the contact electrodes CNE1 and CNE2.

In an embodiment, the concave portions and convex portions of the first pattern portion GP1 may have a curved outer surface. According to the shape of the concave portion and convex portion of the first pattern portion GP1 of the first bank BNL1, the shape of the concave portion and convex portion of the second pattern portion GP2 of the electrodes RME1 and RME2 may be determined. As the outer surface of the concave portion and convex portion may have a curved shape, light emitted from the light emitting element ED and reflected from the second pattern portion GP2 may be uniformly refracted or reflected in the concave portions and the convex portions. Accordingly, the second pattern portion GP2 of the electrodes RME1 and RME2 have an effect of uniformly scattering the light emitted from the light emitting element ED.

The contact electrodes CNE1 and CNE2 of the display device 10 may include a material different from the first insulating layer PAS1, the third insulating layer PAS3, and the fourth insulating layer, and may have different refractive indices. Among the contact electrodes CNE1 and CNE2, for example, the fourth pattern portion GP4 of the second contact electrode CNE2 may be formed at an interface with the third insulating layer PAS3, and light incident on the fourth pattern portion GP4 may be refracted or reflected according to a difference in refractive index between the contact electrodes CNE1 and CNE2 and the third insulating layer PAS3. Although not shown in the drawings, in the case of the first contact electrode CNE1, the fourth pattern portion GP4 of the first contact electrode CNE1 may be formed at an interface with the fourth insulating layer PAS4, and light incident on the fourth pattern portion GP4 may be refracted or reflected according to a difference in refractive index between the contact electrodes CNE1 and CNE2 and the fourth insulating layer PAS4. Light incident from a layer having a high refractive index to a layer having a low refractive index may be totally reflected according to the incident angle thereof. According to an embodiment, the contact electrodes CNE1 and CNE2 may include a material having a higher refractive index than the first insulating layer PAS1, the third insulating layer PAS3, and the fourth insulating layer PAS4. For example, the refractive index of the third insulating layer PAS3 may be smaller than the refractive index of the second contact electrode CNE2, and the refractive index of the fourth insulating layer PAS4 may be smaller than the refractive index of the first contact electrode CNE1. A part of the light incident on the fourth pattern portion GP4 may be refracted by the third insulating layer PAS3 or the fourth insulating layer PAS4, and another part thereof may be reflected by the first insulating layer PAS1. Light refracted from the contact electrodes CNE1 and CNE2 to the third insulating layer PAS3 or the fourth insulating layer PAS4 may be emitted to the outside through the third insulating layer PAS3 and the fourth insulating layer PAS4 (refer to 'L1_R' in FIG. 7). In a side where the second contact electrode CNE2 is disposed, the third insulating layer PAS3 and the fourth insulating layer PAS4 may include substantially the same material so that a difference in refractive index between them may be small, and light incident on the fifth pattern portion GP5 disposed at the interface between the third insulating layer PAS3 and the fourth insulating layer PAS4 may be emitted without being reflected.

On the other hand, in the light incident on the fourth pattern portion GP4, the light reflected by the first insulating layer PAS1 may be incident on the third pattern portion GP3 which may be the interface between the first insulating layer PAS1 and the contact electrodes CNE1 and CNE2. Any light may be reflected from the third pattern portion GP3 to the contact electrodes CNE1 and CNE2 each having a large refractive index, and may be incident on the fourth pattern portion GP4 again.

In this way, the light emitted from the light emitting element ED may be reflected from the second pattern portion GP2 of the electrodes RME1 and RME2 and reflected to other portions of the electrodes RME1 and RME2 or incident on the third pattern portion GP3 of the first insulating layer PAS1. The second pattern portion GP2 may include the concave portions and convex portions to reflect light emitted from the light emitting element ED in various directions. Light incident on the third pattern portion GP3 of the first insulating layer PAS1 may be incident on the contact electrodes CNE1 and CNE2, and may be repeatedly refracted and reflected by the fourth pattern portion GP4 and the third pattern portion GP3. A part of the light emitted from the light emitting element ED may travel in a lateral direction rather than an upward direction within the contact electrodes CNE1 and CNE2. In particular, since the second pattern portion GP2 of the electrodes RME1 and RME2 may include concave portions and convex portions, light emitted from the light emitting element ED may be scattered, so that the amount of light refracted toward both ends or lateral surface of the light emitting element ED and moving within the contact electrodes CNE1 and CNE2 may increase.

In the display device 10, even in case that light emitted from the light emitting element ED travels toward a specific direction, the light may be scattered in various directions by the second pattern portion GP2 of the electrodes RME1 and RME2 and the layers having different refractive indices, for example, the pattern portions GP3 and GP4 of the contact electrodes CNE1 and CNE2 and the first insulating layer PAS1. Accordingly, in the display device 10, light may be emitted even in an area in which the light emitting elements ED may not be arranged in the light emitting area EMA, so that light emission efficiency and side visibility of the light emitted from the light emitting element ED may be improved.

In the first pattern portion GP1 of the first bank BNL1, the pattern height GH may be defined by a difference in height between the concave portion and the convex portion. For example, the pattern height GH of the first pattern portion GP1 may be calculated as a vertical distance between an extension line connecting the lowermost end of the concave portions and an extension line connecting the uppermost end of the convex portions. The pattern height GH of the first pattern portion GP1 may be equal to the pattern height of each of the pattern portions of other layers disposed on the first pattern portion GP1. The degree of scattering of light emitted from the light emitting element ED may vary depending on the pattern height GH of the first pattern portion GP1. According to an embodiment, the pattern height GH of the first pattern portion GP1 may have a size of half ($\lambda/2$) or more of a wavelength of light emitted from the light emitting element ED. In case that the pattern height GH of the first pattern portion GP1 is less than half ($\lambda/2$) of the wavelength of the light emitted from the light emitting element ED, the amount of reflected light may be larger than the amount of scattered light. In order to maximize the scattering effect of light in the second pattern portion GP2 of the electrodes RME1 and RME2, the pattern height GH of the first pattern portion GP1 may be half ($\lambda/2$) or more of the wavelength of the light emitted from the light emitting element ED.

In the first bank BNL1, a first inclination angle $\theta$ of the side surface on which the first pattern portion GP1 may be disposed may be defined. The first inclination angle $\theta$ of the first pattern portion GP1 may be defined as an inclination angle between the upper surface of the via layer VIA or the lower surface of the first bank BNL1 and an extension line connecting portions where the concave portions or convex portions of the first pattern portion GP1 contact each other. In other embodiments, the first inclination angle $\theta$ may also be defined as an inclination angle between an extension line connecting the lowermost ends of the concave portions or an extension line connecting the uppermost ends of the convex portions and the lower surface of the first bank BNL1.

In the first bank BNL1, in addition to the first pattern portion GP1, the first inclination angle $\theta$ may be adjusted to effectively scatter light emitted from the light emitting element ED. The incident angle of light emitted from the light emitting element ED and incident on the second pattern portion GP2 of the electrodes RME1 and RME2 may vary depending on the size of the first inclination angle $\theta$, which may influence the scattering of the light in the lateral direction. In an embodiment, the first inclination angle $\theta$ of the first bank BNL1 may have a range of about 40° to about 80°. As the first bank BNL1 has a first inclination angle $\theta$ within the above range, among the light emitted from both ends of the light emitting element ED, the amount of light scattered in a lateral direction and traveling within the contact electrodes CNE1 and CNE2 may increase.

Figure 8:
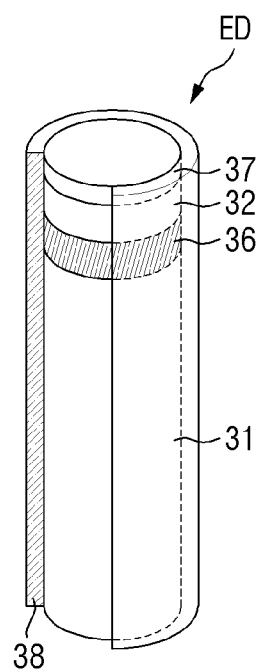
FIG. 8 is a schematic view of a light emitting element according to an embodiment.

FIG. 8 is a schematic view of a light emitting element according to an embodiment.

Referring to FIG. 8, the light emitting element ED may be a light emitting diode. Specifically, the light emitting element ED may be an inorganic light emitting diode having a size of a micrometer or a nanometer and made of an inorganic material. In case that an electric field is formed between two electrodes facing each other in a direction, the organic light emitting diode may be aligned between the two electrodes having polarity.

The light emitting element ED may have a shape extending in a direction. The light emitting element ED may have a shape of a cylinder, a rod, a wire, or a tube. However, the shape of the light emitting element ED is not limited thereto, and the light emitting element ED may have various shapes such as a cube, a cuboid, and a hexagonal column, or may have a shape extending in a direction and having partially inclined outer surface.

The light emitting element ED may include semiconductor layers doped with any conductive type (for example, p-type or n-type) impurity. The semiconductor layers may receive an electrical signal applied from an external power source and emit light of a specific wavelength band. The light emitting element ED may include a first semiconductor layer 31, a second semiconductor layer 32, a light emitting layer 36, an electrode layer 37, and an insulating film 38.

The first semiconductor layer 31 may be an n-type semiconductor. The first semiconductor layer 31 may include a semiconductor material having a chemical formula of $Al_xGa_yIn_{1-x-y}N$ ($0 \leq x \leq 1, 0 \leq y \leq 1, 0 \leq x+y \leq 1$). For example, the first semiconductor layer 31 may include at least one of AlGaInN, GaN, AlGaN, InGaN, AlN, and InN, each being doped with n-type impurities. The n-type dopant doped on the first semiconductor layer 31 may be at least one of Si, Ge, and Sn.

The second semiconductor layer 32 may be disposed on the first semiconductor layer 31 with the light emitting layer 36 interposed therebetween. The second semiconductor layer 32 may be a p-type semiconductor. The second semiconductor layer 32 may include a semiconductor material having a chemical formula of $Al_xGa_yIn_{1-x-y}N$ ($0 \leq x \leq 1$, $0 \leq y \leq 1$, $0 \leq x+y \leq 1$). For example, the second semiconductor layer 32 may include at least one of AlGaInN, GaN, AlGaN, InGaN, AlN, and InN, each being doped with p-type impurities. The p-type dopant doped on the second semiconductor layer 32 may be at least one of Mg, Zn, Ca, Se, and Ba.

Although it is shown in FIG. 8 that each of the first semiconductor layer 31 and the second semiconductor layer 32 may be formed as one layer, the disclosure is not limited thereto. Each of the first semiconductor layer 31 and the second semiconductor layer 32 may further include a larger number of layers, for example, clad layers or tensile strain barrier reducing (TSBR) layers according to the material of the light emitting layer 36.

The light emitting layer 36 may be disposed between the first semiconductor layer 31 and the second semiconductor layer 32. The light emitting layer 36 may include a material of a single or multiple quantum well structure. In case that the light emitting layer 36 includes a material of a multiple quantum well structure, the light emitting layer 36 may have a structure in which quantum layers and well layers are alternately stacked. The light emitting layer 36 may emit light by the combination of electron-hole pairs according to an electrical signal applied through the first semiconductor layer 31 and the second semiconductor layer 32. The light emitting layer 36 may include a material such as AlGaN or AlGaInN. In particular, in case that the light emitting layer 36 has a multiple quantum well structure in which quantum layers and well layers are alternately stacked, the quantum layers may include a material such as AlGaN or AlGaInN, and the well layers may include a material such as GaN or AlInN.

The light emitting layer 36 may have a structure in which semiconductor materials having high bandgap energy and semiconductor materials having low bandgap energy may be alternately stacked, and may include other group 3 to group 5 semiconductor materials depending on the wavelength band of light. The light emitted from the light emitting layer 36 is not limited to light of a blue wavelength band, and in some cases, the light emitting layer 36 may emit light of a red or green wavelength band.

The electrode layer 37 may be an ohmic contact electrode. However, the disclosure is not limited thereto, and the electrode layer 37 may be a Schottky contact electrode. The light emitting element ED may include at least one electrode layer 37. The light emitting element ED may include at least one or more electrode layer, but the disclosure is not limited thereto, and the electrode layer 37 may be omitted.

In case that the light emitting element ED is electrically connected to an electrode or a contact electrode in the display device 10, the electrode layer 37 may reduce resistance between the light emitting element ED and the electrode or the contact electrode. The electrode layer 37 may include a conductive metal. For example, the electrode layer 37 may include at least one of aluminum (Al), titanium (Ti), indium (In), gold (Au), silver (Ag), indium tin oxide (ITO), indium zinc oxide (IZO), and indium tin-zinc oxide (ITZO).

The insulating film 38 may be disposed to surround the outer surfaces of the above-described semiconductor layers and electrode layers. For example, the insulating film 38 may be disposed to surround at least the outer surface of the light emitting layer 36, and may be formed such that ends of the light emitting element ED in a length direction may be exposed. Further, the insulating film 38 may be formed to have a cross-sectional rounded upper surface in an area adjacent to at least one end of the light emitting element ED.

The insulating film 38 may include a material having insulating properties, for example, silicon oxide ($SiO_x$), silicon nitride ($SiN_x$), silicon oxynitride ($SiO_xN_y$), aluminum nitride ($AlN_x$), aluminum oxide ($AlO_x$), or a combination thereof. Although it is shown in the drawing that the insulating layer 38 is formed as a single layer, the disclosure is not limited thereto. In some embodiments, the insulating film 38 may be formed to have a multi-layer structure in which multiple layers are stacked.

The insulating film 38 may perform a function of protecting the members. The insulating film 38 may prevent an electrical short that may occur in the light emitting layer 36 in case that the light emitting layer 36 is in direct contact with an electrode through which an electrical signal may be transmitted to the light emitting element ED. Further, the insulating film 38 may prevent the deterioration in light emission efficiency of the light emitting element ED.

Further, the outer surface of the insulating film 38 may be surface-treated. The light emitting elements ED may be aligned by being sprayed onto the electrodes in a state in which they are dispersed in an ink. Here, the surface of the insulating film 38 may be hydrophobically or hydrophilically treated in order to maintain the light emitting elements ED in a dispersed state without being aggregated with other adjacent light emitting elements ED in the ink.

Hereinafter, a process of manufacturing the display device 10 will be described with reference to additional drawings.

FIGS. 9 to 15 are schematic cross-sectional views illustrating a process of manufacturing a display device according to an embodiment.

Figure 9:
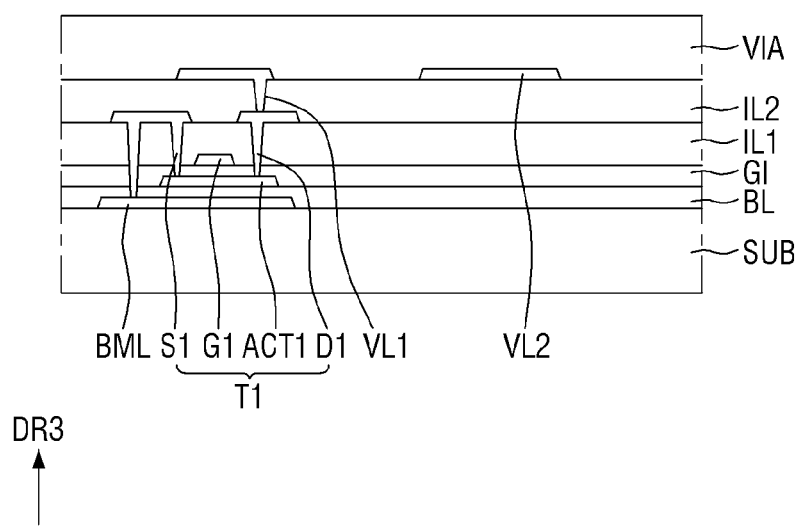
FIGS. 9 to 15 are schematic cross-sectional views illustrating a process of manufacturing a display device according to an embodiment.

First, referring to FIG. 9, a substrate SUB may be prepared, and a circuit layer CCL including conductive layers and insulating layers, and a via layer VIA may be formed on the substrate SUB. Since a description of the arrangement of the circuit layer CCL and the via layer VIA may be the same as that described above, details thereof will be omitted.

Figure 10:
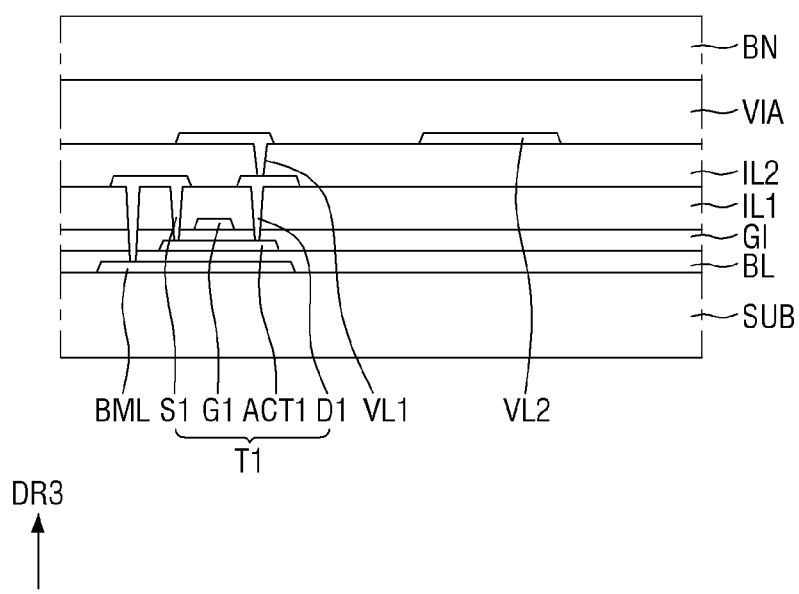
Figure 11:
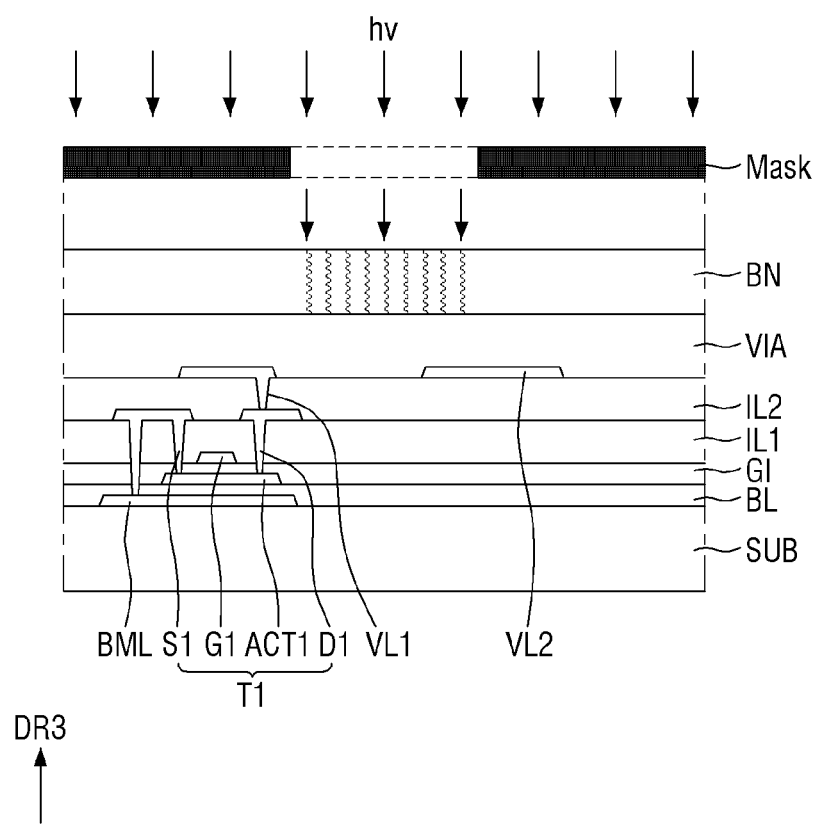
Figure 12:
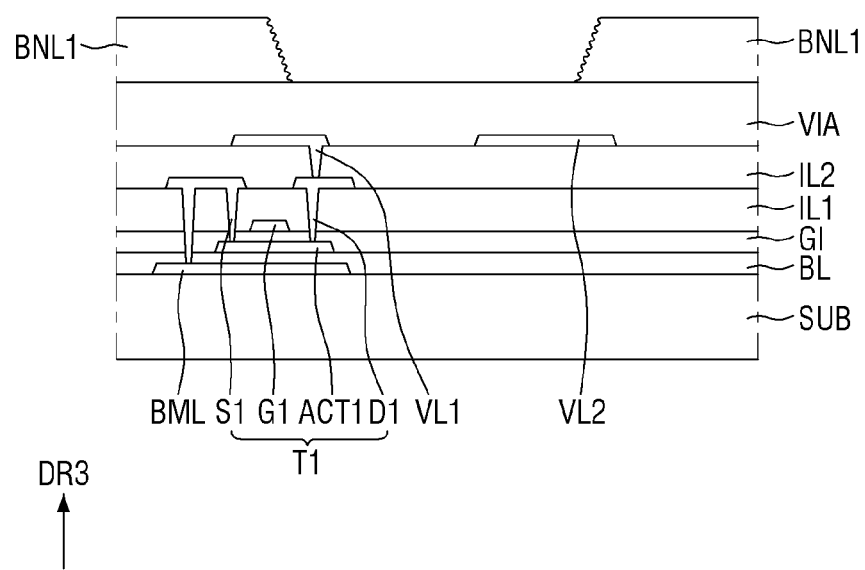

Referring to FIGS. 10 to 12, a first bank BNL1 including a first pattern portion GP1 may be formed on the via layer VIA. The process of forming the first bank BNL1 may be performed by forming a bank layer BN made of a material constituting the first bank BNL1 on the via layer VIA and partially patterning the bank layer BNL1. In an embodiment, during the process of patterning the bank layer BN, the shape of the first pattern portion GP1 formed on the inclined side surface of the first bank BNL1 may be changed according to the frequency and intensity of the light hv applied during an exposure process.

As shown in FIG. 11, in the process of patterning the bank layer BN, a part of the bank layer BN may be irradiated with light hv using a mask. According to an embodiment, the exposure process of the bank layer BN may be performed by an exposure apparatus using a light source having a short wavelength. In case that the light hv applied to the bank layer BN has a short wavelength, incident light applied to the bank layer BN and reflective light reflected from the layers under the bank layer BN may cause light interference. A standing wave may be formed in the bank layer BN due to the interference of the incident light and the reflective light. According to the waveform of the standing wave, the intensity of light applied to the bank layer BN may vary depending on the position, and the development speed of the bank layer BN may vary. Accordingly, in the first bank BNL1 formed by patterning the bank layer BN, multiple concave portions and multiple convex portions may be formed on the inclined side surface of the first bank BNL1 according to a difference in development speed. The pattern height GH of the first pattern portion GP1 formed in the first bank BNL1 and the periods of the concave portions and convex portions may vary according to the intensity and frequency of the short-wavelength light applied in the exposure process. In case that the intensity of the short-wavelength light increases, the depths of the concave portion and the convex portion may increase, so that the pattern height GH of the first pattern portion GP1 may increase. In case that the frequency of the short-wavelength light increases, the bending of the first pattern portion GP1 increases as the widths of the concave portion and the convex portion decrease, so that light scattering may increase. According to an embodiment, the bending period and pattern height GH of the first pattern portion GP1 formed in the first bank BNL1 may be adjusted through the intensity and frequency of light applied in the exposure process during the process of manufacturing the display device 10, and the bending of the first pattern portion GP1 that may be required for effective light scattering may be optimized.

Figure 13:
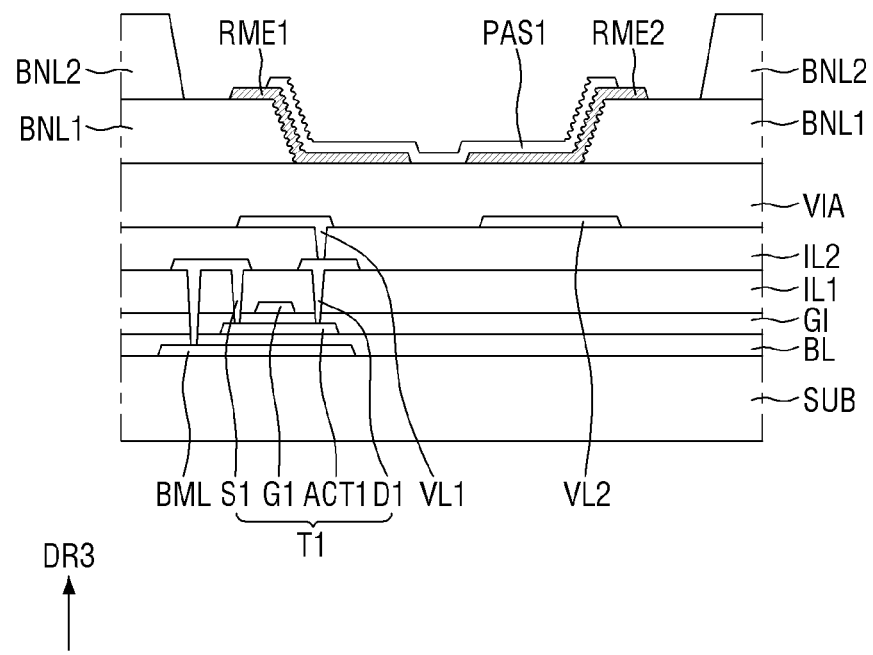
Figure 14:
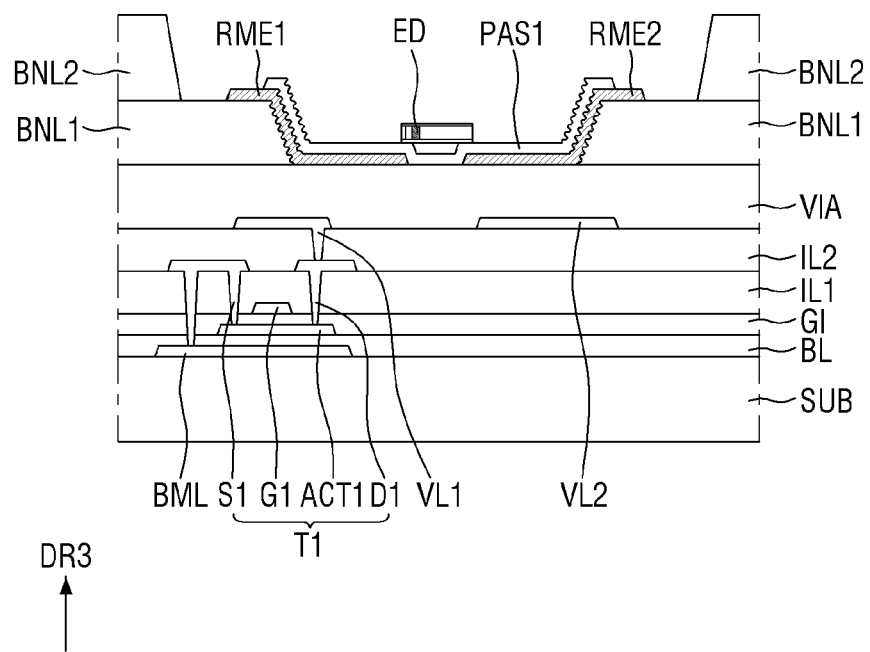

Referring to FIGS. 13 and 14, electrodes RME1 and RME2, a first insulating layer PAS1, and a second bank BNL2 may be formed on the first bank BNL1, and a light emitting element ED may be disposed on the first insulating layer PAS1. In an embodiment, the light emitting element ED is prepared in a state of being dispersed in ink, and the ink may be sprayed to each light emitting area EMA through an inkjet printing process. The second bank BNL2 may prevent the ink from overflowing into the light emitting area EMA of another adjacent sub-pixel PXn. In case that the ink is sprayed to the light emitting area EMA, an alignment signal may be applied to each of the electrodes RME1 and RME2 to generate an electric field on the electrodes RME1 and RME2. Since the light emitting element ED dispersed in the ink receives a dielectrophoretic force by the electric field, its position and orientation direction change, and simultaneously ends of the light emitting element ED may be disposed on the different electrodes RME1 and RME2.

Figure 15:
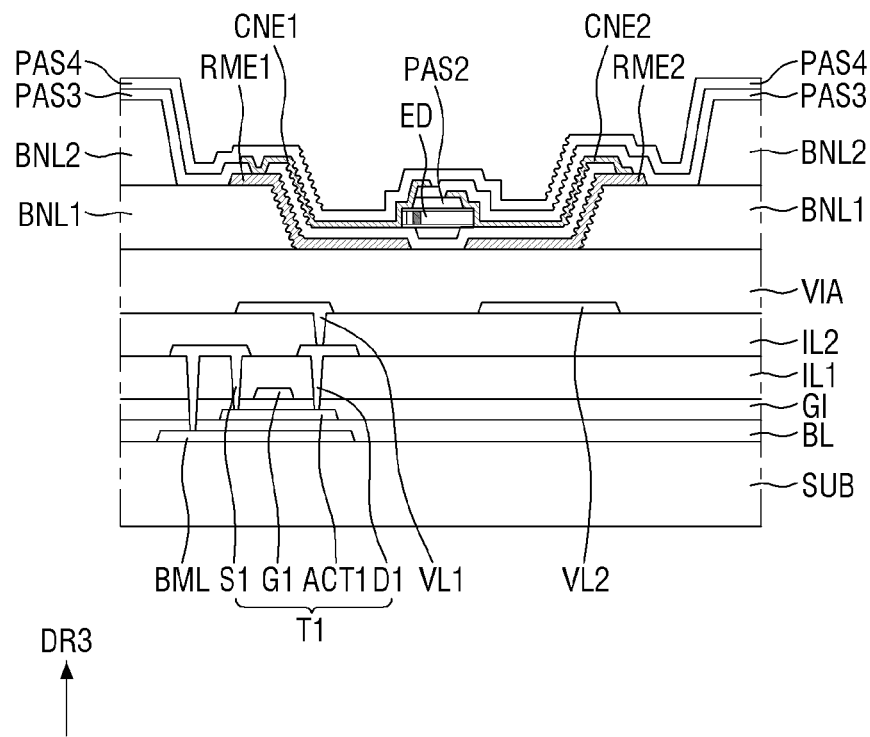

Referring to FIG. 15, a second insulating layer PAS2, contact electrodes CNE1 and CNE2, a third insulating layer PAS3, and a fourth insulating layer PAS4 may be formed on the light emitting element ED to manufacture the display device 10.

Through the above process, the display device 10 according to an embodiment may be manufactured. In a process of manufacturing the display device 10, during a process of forming the first bank BNL1, the first pattern portion GP1 of the first bank BNL1 may be formed by using a light source of an exposure apparatus for patterning the bank layer BN as a short-wavelength light source. The bending period and pattern height GH of the first pattern portion GP1 may be optimized through the intensity and frequency of light emitted from the short-wavelength light source. In the display device 10 according to an embodiment, light emitted from the light emitting element ED is scattered by multiple pattern portions, so that light emission efficiency and side visibility may be improved.

Hereinafter, various embodiments of the display device 10 will be described with reference to additional drawings.

Figure 16:
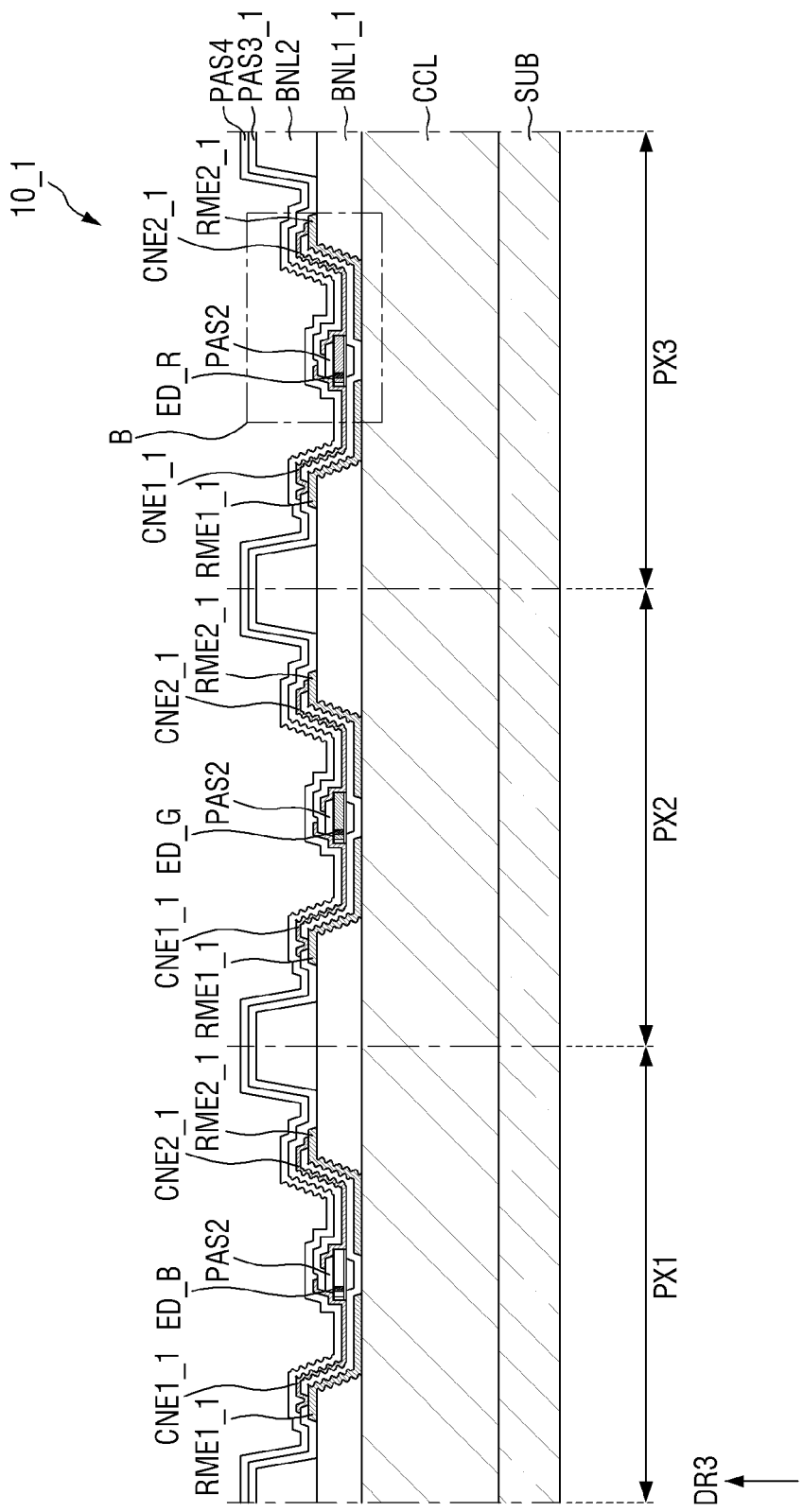
FIG. 16 is a schematic plan view illustrating a pixel of a display device according to another embodiment.
Figure 17:
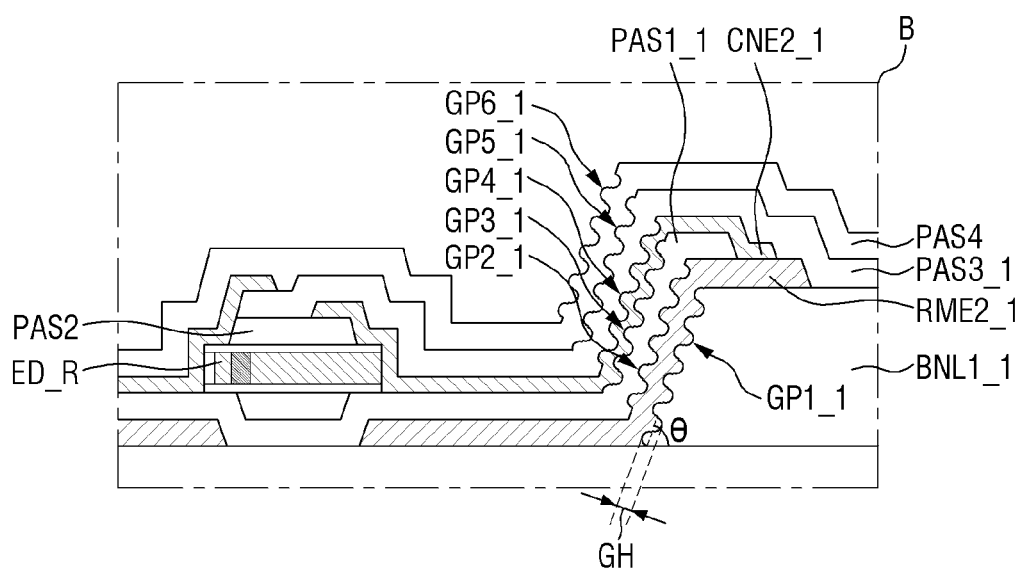
FIG. 17 is an enlarged schematic view of portion B in FIG. 16.

FIG. 16 is a schematic plan view illustrating a pixel of a display device according to another embodiment. FIG. 17 is an enlarged schematic view of portion B in FIG. 16. FIG. 17 schematically illustrates a light emitting element ED_R and a first pattern portion GP1_1 of a first bank BNL1_1, which may be provided in the third sub-pixel PX3.

Referring to FIGS. 16 and 17, the display device 10_1 according to an embodiment may include a different light emitting element ED (ED_B, ED_G, or ED_R) for each sub-pixel PXn, and each light emitting element ED may emit light having different center wavelength bands. Accordingly, the pattern height GH of the first pattern portion GP1_1 formed on the inclined side surface of the first bank BNL1_1 may vary.

In the display device 10_1, the first sub-pixel PX1, the second sub-pixel PX2, and the third sub-pixel PX3 may be provided with light emitting elements ED (ED_B, ED_G, and ED_R) for emitting light of different colors, respectively. For example, the first sub-pixel PX1 may be provided with a first light emitting element ED_B for emitting blue light, the second sub-pixel PX2 may be provided with a second light emitting element ED_G for emitting green light, and the third sub-pixel PX3 may be provided with a third light emitting element ED_R for emitting red light. In each sub-pixel PXn, light of different colors from each other may be emitted depending on the light emitted from the light emitting element ED.

As described above, in order to improve a light scattering effect, the pattern height GH of the first pattern portion GP1_1 of the first bank BNL1_1 may vary according to the wavelength λ of light emitted from the light emitting element ED. The first light emitting element ED_B may emit blue light, the third light emitting element ED_R may emit red light, and the wavelength (λ) of light emitted from the third light emitting element ED_R may be longer than that of light emitted from other light emitting elements ED_B and ED_G.

Regardless of the type of the light emitting elements ED provided in the respective sub-pixels PXn, the pattern height GH of the first pattern portion GP1_1 of the first bank BNL1_1 may be adjusted based on the wavelength of light emitted from the third light emitting element ED_R. According to an embodiment, the first banks BNL1_1 provided in the respective sub-pixels PXn, the pattern height GH of the first pattern portion GP1_1 may be half (λ/2) or more of a wavelength of light emitted from the third light emitting element ED_R. In some embodiments, the first light emitting element ED_B may emit light having a central wavelength band ranging from about 450 nm to about 492 nm, the second light emitting element ED_G may emit light having a central wavelength band ranging from about 490 nm to about 577 nm, and the third light emitting element ED_R may emit light having a central wavelength band ranging from about 600 nm to about 780 nm. Accordingly, the pattern height GH of the first pattern portion GP1_1 may be about 390 nm or more.

In case that the pattern height GH of the first pattern portion GP1_1 is half (λ/2) or more of the wavelength of the light emitted from the light emitting element ED, a light scattering effect may be maximized. In an embodiment in which the sub-pixels PXn respectively include different types of light emitting elements ED, the pattern height GH of the first pattern portion GP1_1 of the first bank BNL1_1 may be adjusted based on the third light emitting element ED_R, which may be a light emitting element ED having the longest wavelength of emitted light. In the display device 10_1 according to an embodiment, the sub-pixels PXn include different types of light emitting elements ED, respectively, but a light scattering effect may be improved by adjusting the pattern height GH of the first pattern portion GP1_1 of the first bank BNL1_1.

Figure 18:
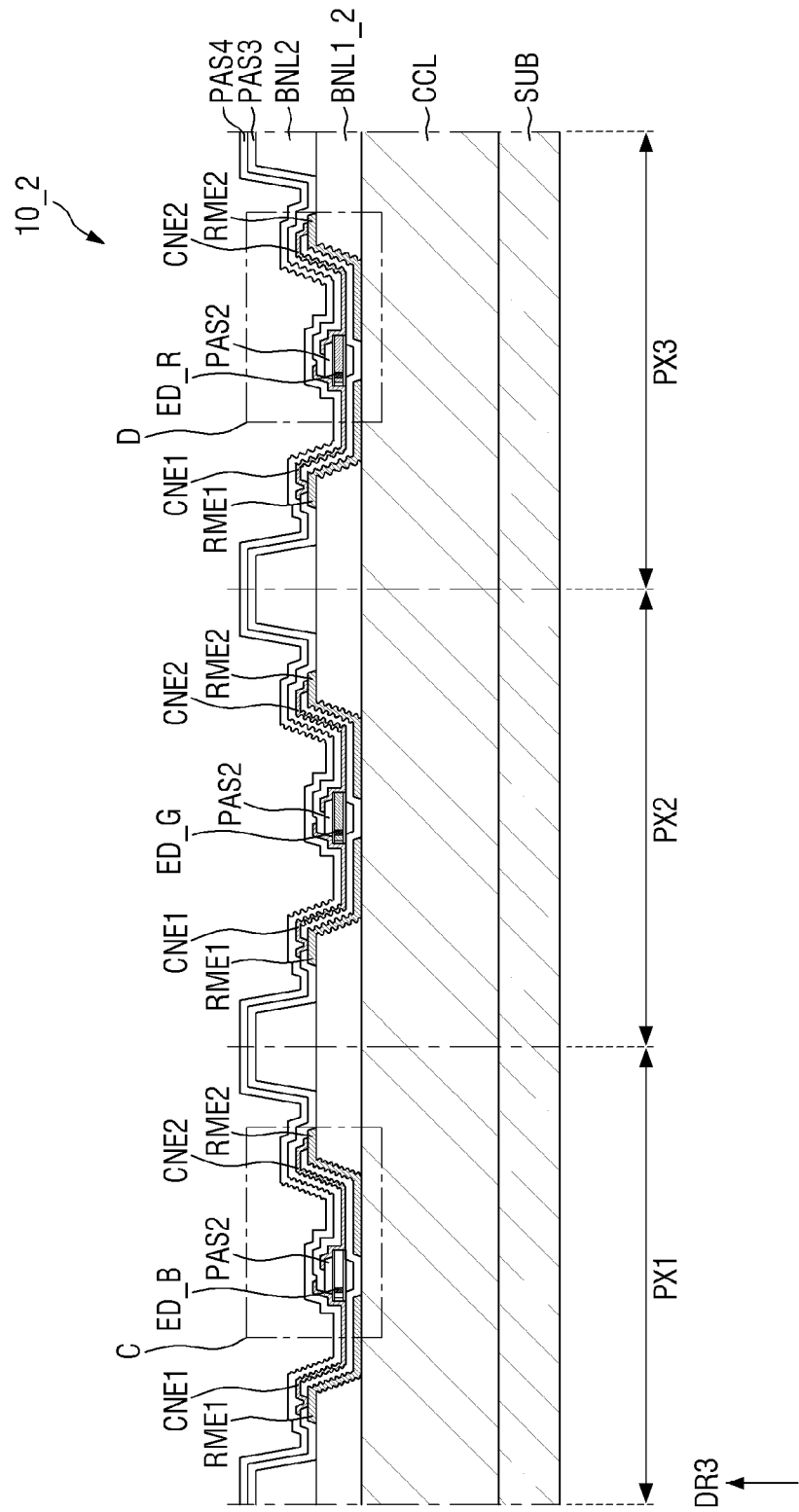
FIG. 18 is a schematic plan view illustrating a pixel of a display device according to another embodiment.
Figure 19:
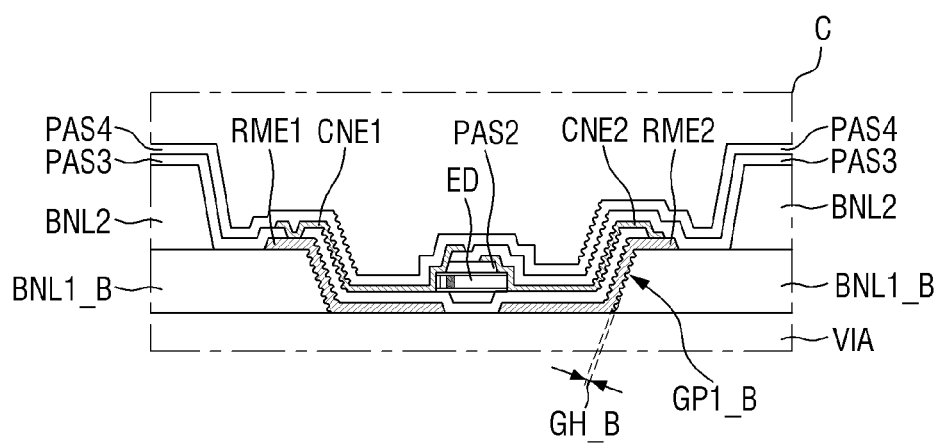
FIG. 19 is an enlarged schematic view of portions C and D in FIG. 18.
Figure 19:
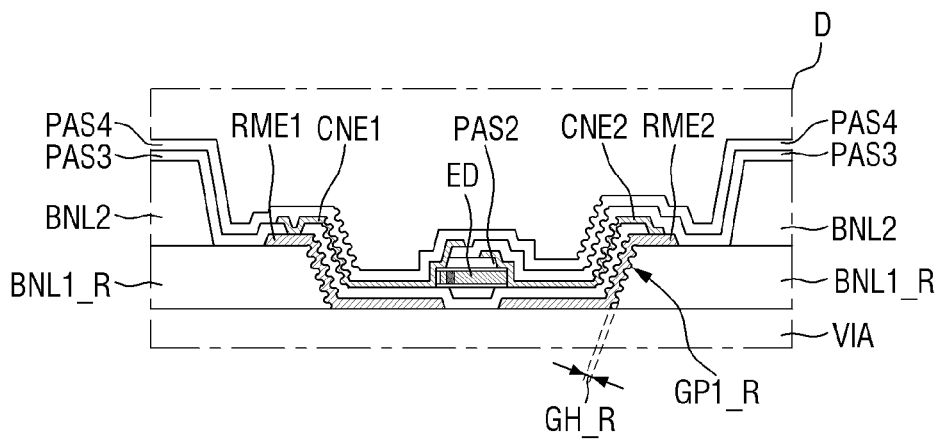

FIG. 18 is a schematic plan view illustrating a pixel of a display device according to another embodiment. FIG. 19 is an enlarged schematic view of portions C and D in FIG. 18. FIG. 19 schematically illustrates light emitting element ED_B and ED_R and first pattern portions GP1_2 of first banks BNL1_2, which are provided in the first sub-pixel PX1 and the third sub-pixel PX3.

Referring to FIGS. 18 and 19, in a display device 10_2 according to an embodiment, the pattern heights GH of the pattern units GP1_2 of the first banks BNL1_2 disposed in the respective sub-pixels PXn may be different from each other according to a center wavelength band of light emitted from the light emitting element ED. As described above, the display device 10_2 may include light emitting elements ED (ED_B, ED_G and ED_R) that emit light of different wavelengths for each sub-pixel PXn, and thus the pattern heights GH of the first pattern portions GP1 of the first banks BNL1 of the respective sub-pixels PXn may be different from each other.

Explaining the first sub-pixel PX1 and the third sub-pixel PX3 as examples, the first light emitting element ED_B disposed in the first sub-pixel PX1 may emit blue light, and the third light emitting element ED_R disposed in the third sub-pixel PX3 may emit red light. The pattern height GH_B of the first pattern portion GP1_B of the first bank BNL1_B of the first sub-pixel PX1 may be smaller than the pattern height GH_R of the first pattern portion GP1_R of the first bank BNL1_R of the third sub-pixel PX3. Although not shown in the drawings, the pattern height GH of the first pattern portion GP1 of the first bank BNL1 of the second sub-pixel PX2 may be larger than that of the first pattern portion GP1_B of the first sub-pixel PX1, but may be smaller than that of the first pattern portion GP1_R of the third sub-pixel PX3.

In an embodiment, the first pattern portion GP1_B of the first bank BNL1_B disposed in the first sub-pixel PX1 may have a pattern height GH_B of about 246 nm or more, the first pattern portion GP1 of the first bank BNL1 disposed in the second sub-pixel PX2 may have a pattern height GH of about 288 nm or more, and the first pattern portion GP1_R of the first bank BNL1_R disposed in the third sub-pixel PX3 may have a pattern height GH_R of about 390 nm or more. In the display device 10_2, the sub-pixels PXn are provided with different types of light emitting elements ED and first banks BNL1_2, respectively, and thus a light scattering effect may be improved in accordance with the corresponding sub-pixel PXn.

Figure 20:
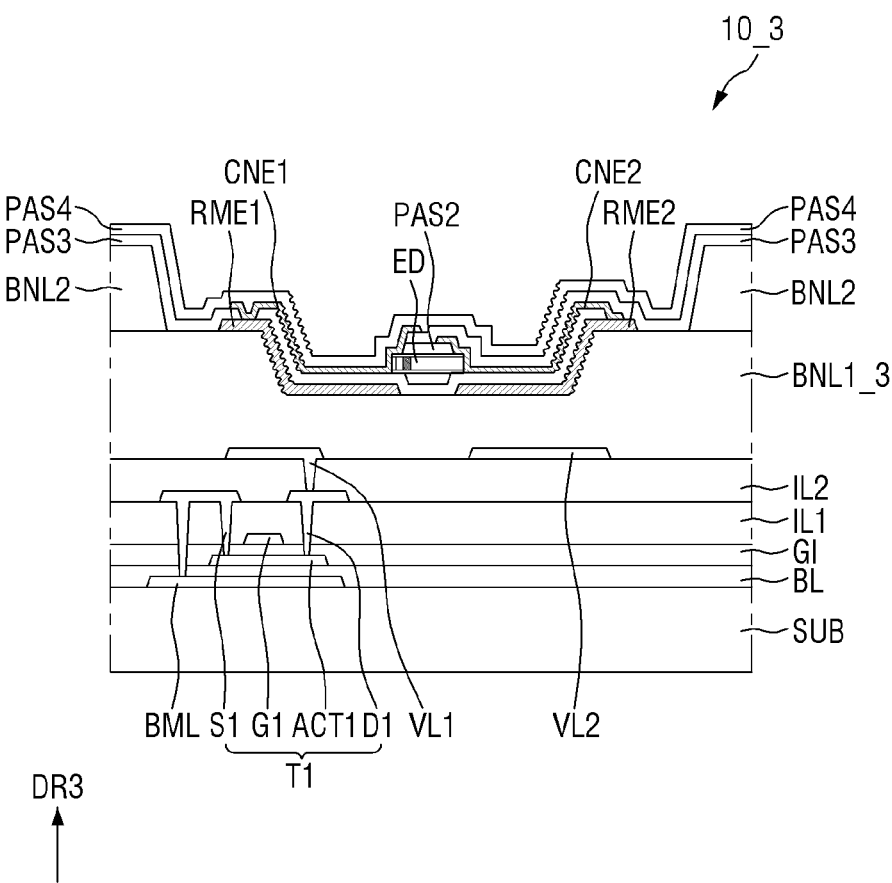
FIG. 20 is a schematic cross-sectional view illustrating a part of a display device according to another embodiment.

FIG. 20 is a schematic cross-sectional view illustrating a part of a display device according to another embodiment.

Referring to FIG. 20, in a display device 10_3 according to an embodiment, a via layer VIA and a first bank BNL1_3 may be integrated with each other. As described above, the via layer VIA and the first bank BNL1_3 may include the same material, and may be integrated with each other to be formed into one layer. The via layer VIA may be integrated with the first bank BNL1_3 and thus omitted, and the first bank BNL1_3 may be directly disposed on the fourth conductive layer and the second interlayer insulating layer IL2.

The first bank BNL1_3 may be on the fourth conductive layer to have a shape in which a part of the upper surface thereof is partially recessed. The recessed portion of the first bank BNL1_3 may have an inclined side surface, and the first bank BNL1_3 may include first pattern portions GP1 disposed on the inclined side surface. The first pattern portions GP1 of the first bank BNL1_3 may be disposed on both side surfaces of the recessed portion, respectively.

The electrodes RME1 and RME2 may be disposed on the first bank BNL1_3, but may be spaced apart from each other within the recessed portion of the first bank BNL1_3. The first electrode RME1 may be disposed to cover any one of the first pattern portions GP1 of the first bank BNL1_3, and the second electrode RME2 may be disposed to cover the others of the first pattern portions GP1 of the first bank BNL1_3. The embodiment may be different in that the via layer VIA is integrated with the first bank BNL1_3. Other elements may be the same as those described above.

Figure 21:
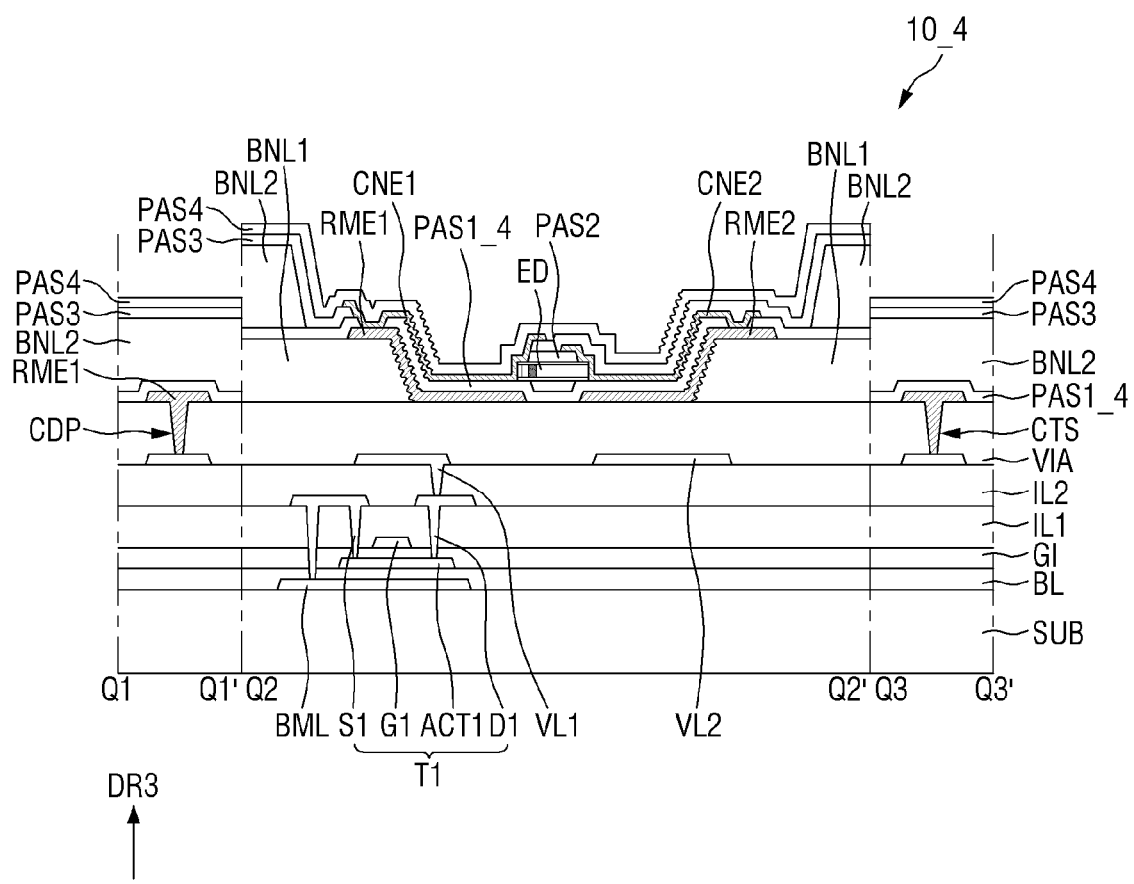
FIG. 21 is a schematic cross-sectional view illustrating a part of a display device according to another embodiment.

FIG. 21 is a schematic cross-sectional view illustrating a part of a display device according to another embodiment.

Referring to FIG. 21, in a display device 10_4 according to an embodiment, a first insulating layer PAS1_4 may be entirely disposed on the first bank BNL1 and the via layer VIA. In the display device 10_4, the first insulating layer PAS1_4 may be disposed even between the first bank BNL1 and the second bank BNL2, and may cover the electrodes RME1 and RME2 under the second bank BNL2. Since the first insulating layer PAS1_4 is disposed even between the second bank BNL2 and the via layer VIA, portions of the first electrode RME1 and the second electrode RME2, the portions disposed under the second bank BNL2, may be covered by the first insulating layer PAS1_4. As the first insulating layer PAS1_4 may be disposed in a larger area, the interface between the contact electrodes CNE1 and CNE2 and the first insulating layer PAS1_4 may be increased, and the side scattering effect of light emitted from the light emitting element ED may be further improved.

Figure 22:
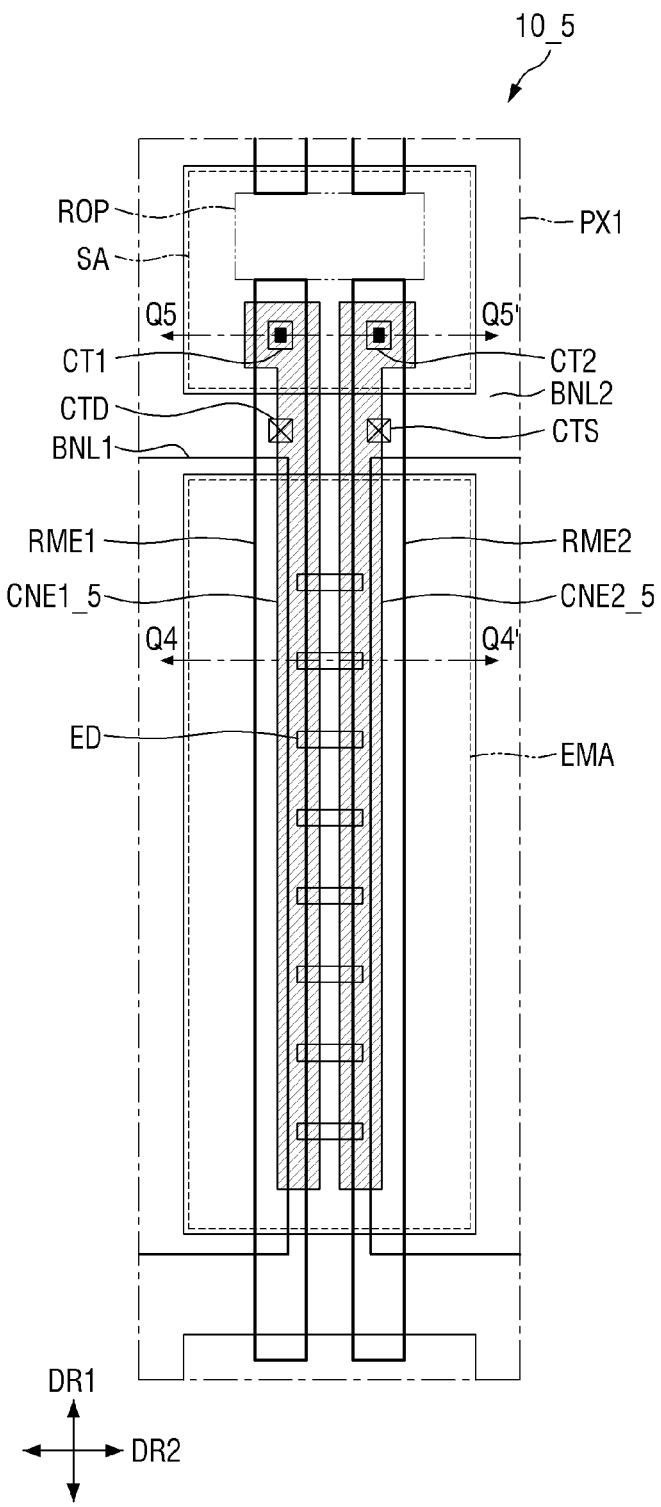
FIG. 22 is a schematic plan view illustrating a sub-pixel of a display device according to another embodiment.
Figure 23:
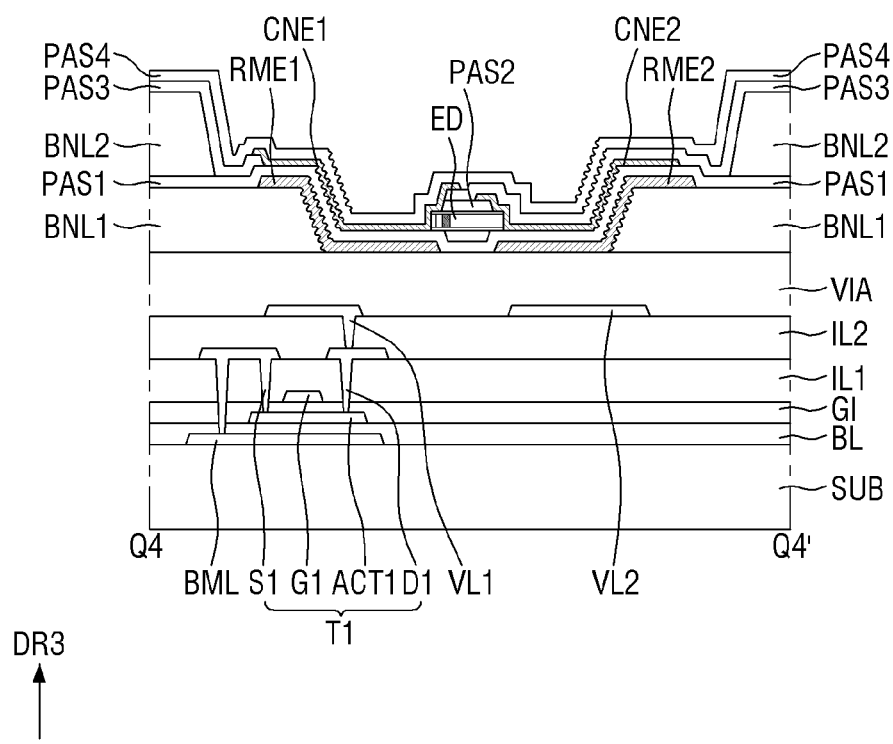
FIG. 23 is a schematic cross-sectional view taken along line Q4-Q4' of FIG. 22.
Figure 24:
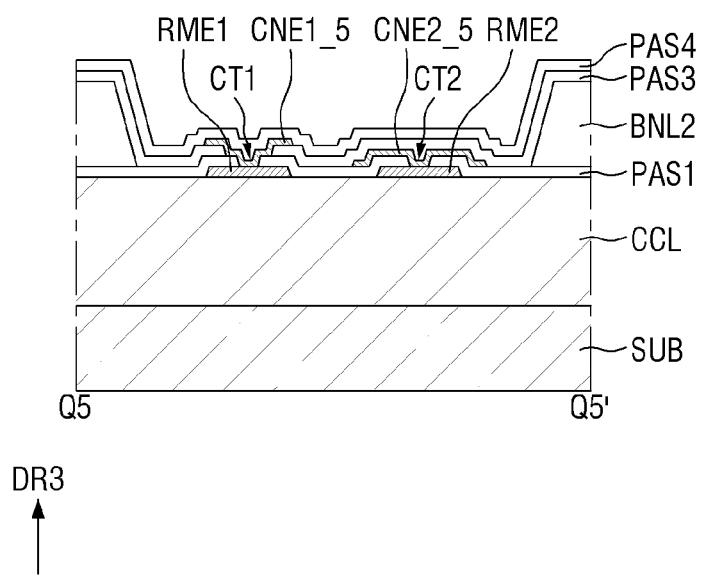
FIG. 24 is a schematic cross-sectional view taken along line Q5-Q5' of FIG. 22.

FIG. 22 is a schematic plan view illustrating a sub-pixel of a display device according to another embodiment. FIG. 23 is a cross-sectional view taken along line Q4-Q4' of FIG. 22. FIG. 24 is a schematic cross-sectional view taken along line Q5-Q5' of FIG. 22. FIG. 23 illustrates a cross-section across ends of a light emitting element ED disposed in a light emitting area EMA, and FIG. 24 illustrates a cross-section across contact units CT1 and CT2.

Referring to FIGS. 22 to 24, in a display device 10_5 according to an embodiment, a first insulating layer PAS1_5 may include contact portions CT1 and CT2 exposing parts of the upper surfaces of electrodes RME1 and RME2 in the sub-area SA. Unlike the embodiment of FIG. 21, in the display device 10_5, a portion where the upper surfaces of the electrodes RME1 and RME2 are exposed may be formed to be spaced apart from an area where the light emitting elements ED are disposed in the first direction DR1. In the display device 10_5, the first insulating layer PAS1_5 may include contact portions CT1 and CT2 covering the upper surfaces of the electrodes RME1 and RME2 in the light emitting area EMA and exposing parts of the upper surfaces of electrodes RME1 and RME2 in the sub-area SA.

Contact electrodes CNE1_5 and CNE2_5 may be disposed over the light emitting area EMA and the sub-area SA. The contact electrodes CNE1_5 and CNE2_5 may be in contact with at least one of the electrodes RME1 and RME2 through the contact portions CT1 and CT2 disposed in the sub-area SA of the first insulating layer PAS1_5 to expose parts of the upper surfaces of the electrodes RME1 and RME2. Portions of the contact electrodes CNE1_5 and CNE2_5, the portions disposed in the light emitting area EMA, may be in contact with the light emitting elements ED, and the portions disposed in the sub-area SA may be in contact with the electrodes RME1 and RME2 through the contact portions CT1 and CT2. The contact electrodes CNE1_1 and CNE2_1 may be partially disposed on the second bank BNL2 between the light emitting area EMA and the sub-area SA.

The first contact electrode CNE1_5 and the second contact electrode CNE2_5 may be arranged on the first electrode RME1_5 and the second electrode RME2_5, respectively. Each of the first contact electrode CNE1_5 and the second contact electrode CNE2_5 may have a shape extending in the first direction DR1, and may form a linear pattern in the light emitting area EMA of each sub-pixel PXn. The first contact electrode CNE1_5 may be in contact with the first electrode RME1 through the first contact portion CT1 exposing the upper surface of the first electrode RME1 in the sub-area SA, and the second contact electrode CNE2_5 may be in contact with the second electrode RME2_1 through the second contact portion CT2 exposing the upper surface of the second electrode RME2 in the sub-area SA.

Accordingly, the light emitted from the light emitting element ED and incident on the contact electrodes CNE1_5 and CNE2_5 may be scattered while being reflected between the first insulating layer PAS1 and the third insulating layer PAS3. In case that the first insulating layer PAS1 partially exposes the electrodes RME1 and RME2 in the light emitting area EMA, a part of the light traveling within the contact electrodes CNE1_5 and CNE2_5 may be reflected from the electrodes RME1 and RME2. In contrast, in the display device 10_5 according to the embodiment, the first insulating layer PAS1 is disposed to entirely cover the electrodes RME1 and RME2 in the light emitting area EMA, so that the light scattering effect by the contact electrodes CNE1_5 and CNE2_5, the first insulating layer PAS1, and the third insulating layer PAS3 may be further improved.

According to a display device according to an embodiment, even in case that light emitted from the light emitting element travels toward a specific direction, the light may be scattered in various directions by pattern portions of electrodes and pattern portions of layers having different refractive indices. Accordingly, light may be emitted even in an area where light emitting elements are not disposed within the light emitting area, so that the light emission efficiency and side visibility of light emitted from the light emitting element may be improved.

In concluding the detailed description, those skilled in the art will appreciate that many variations and modifications can be made to the embodiments without substantially departing from the principles of the disclosure. Therefore, the disclosed embodiments of the disclosure are used in a generic and descriptive sense only and not for purposes of limitation.

What is claimed is:

1. A display device, comprising:
   first banks disposed on a substrate and spaced apart from each other;
   a first electrode and a second electrode disposed on respective first banks of the first banks and spaced apart from each other;
   a first insulating layer disposed on the first electrode and the second electrode; and
   light emitting elements disposed on the first insulating layer and each having ends on the first electrode and the second electrode, wherein
   each of the first banks includes a first pattern portion including concave portions and convex portions,
   the first pattern portions of the first banks are disposed on side surfaces of the first banks, the side surfaces being spaced apart and facing each other, and
   each of the first electrode and the second electrode includes a second pattern portion disposed on the first pattern portion and having a pattern shape corresponding to the first pattern portion on a surface of the second pattern portion.

2. The display device of claim 1, wherein the first insulating layer includes a third pattern portion disposed on the second pattern portion of each of the first electrode and the second electrode and having a pattern shape corresponding to the second pattern portion on a surface of the third pattern portion.

3. The display device of claim 2, further comprising:
   a first contact electrode disposed on the first electrode and contacting the first electrode and an end of the light emitting elements; and
   a second contact electrode on the second electrode to contact the second electrode and another end of the light emitting elements,
   wherein each of the first contact electrode and the second contact electrode includes a fourth pattern portion disposed on the third pattern portion and having a pattern shape corresponding to the third pattern portion on a surface the fourth pattern portion.

4. The display device of claim 3, wherein the first insulating layer has a smaller refractive index than each of a refractive index of the first contact electrode and a refractive index of the second contact electrode.

5. The display device of claim 3, further comprising:
   a second insulating layer on the light emitting elements; and
   a third insulating layer on the second insulating layer and the second contact electrode,
   wherein the first contact electrode is on the third insulating layer.

6. The display device of claim 5, wherein
   the third insulating layer includes a fifth pattern portion disposed on the fourth pattern portion of the second contact electrode and having a pattern shape corresponding to the fourth pattern portion, and
   the third insulating layer has a refractive index smaller than the refractive index of the second contact electrode.

7. The display device of claim 5, further comprising:
   a fourth insulating layer on the third insulating layer and the first contact electrode,
   wherein the fourth insulating layer has a refractive index smaller than the refractive index of the first contact electrode.

8. The display device of claim 1, wherein each of the concave portions and the convex portions of the first pattern portion has an outer surface having a curved shape.

9. The display device of claim 1, wherein the first pattern portion has a pattern height of half or more of a wavelength of light emitted from the light emitting elements, the pattern height being defined as a vertical distance between an imaginary extension line connecting lowermost ends of the concave portions and an imaginary extension line connecting uppermost ends of the convex portions.

10. The display device of claim 1, further comprising:
    a via layer between the substrate and the first banks.

11. The display device of claim 1, further comprising:
    a second bank disposed on the first banks and surrounding a light emitting area in which the light emitting elements are arranged.

12. The display device of claim 11, wherein
the second bank surrounds a sub-area that is spaced apart from the light emitting area and does not include the light emitting elements, and
the first insulating layer covers the first electrode, the second electrode and the first banks in the light emitting area.

13. The display device of claim 12, wherein
the first insulating layer includes:
- a first contact portion exposing a part of an upper surface of the first electrode in the sub-area; and
- a second contact portion exposing a part of an upper surface of the second electrode in the sub-area, and the display device further includes:
- a first contact electrode disposed on the first electrode and contacting an end of one of the light emitting elements and the first electrode exposed through the first contact portion; and
- a second contact electrode disposed on the second electrode and contacting another end of the one of the light emitting elements and the second electrode exposed through the second contact portion.

14. A display device, comprising:
sub-pixels including a light emitting area and arranged in a direction;
first banks disposed over the sub-pixels neighboring in the direction and spaced apart from each other in the direction in the light emitting area;
a first electrode and a second electrode disposed on respective first banks of the first banks in the light emitting area of the sub-pixel and spaced apart from each other in the direction;
a first insulating layer disposed on the first electrode and the second electrode; and
light emitting elements disposed on the first insulating layer and each having ends on the first electrode and the second electrode, wherein
each of the first banks includes a first pattern portion including concave portions and convex portions,
the first pattern portions of the first banks are disposed on side surfaces of the first banks, the side surfaces being spaced apart and facing each other, and
the first pattern portion has a pattern height of half or more of a wavelength of light emitted from one of the light emitting elements, the pattern heigh being defined as a vertical distance between an imaginary extension line connecting lowermost ends of the concave portions and an imaginary extension line connecting uppermost ends of the convex portions.

15. The display device of claim 14, wherein
the sub-pixels include:
- a first sub-pixel in which first light emitting elements emitting light of a first color are arranged; and
- a second sub-pixel in which second light emitting elements emitting light of a second color different from the first color are arranged, and the first pattern portion in the first sub-pixel has a pattern height of half or more of a wavelength of the light of the second color.

16. The display device of claim 14, wherein
the sub-pixel include:
- a first sub-pixel in which first light emitting elements emitting light of a first color are arranged; and
- a second sub-pixel in which second light emitting elements emitting light of a second color different from the first color are arranged, the first pattern portion in the first sub-pixel has a pattern height of half or more of a wavelength of the light of the first color, and
the first pattern portion in the second sub-pixel has a pattern height of half or more of a wavelength of the light of the second color.

17. The display device of claim 15, wherein
the sub-pixels further includes a third sub-pixel in which third light emitting elements emitting light of a third color different from the first color and the second color are arranged, and
the first pattern portion in the first sub-pixel, the second sub-pixel, and the third sub-pixel has a pattern height of half or more of a wavelength of the light of the third color.

18. The display device of claim 17, wherein the pattern height of the first pattern portion in the first sub-pixel, the second sub-pixel, and the third sub-pixel is about 390 nm or more.

19. The display device of claim 14, wherein
each of the first electrode and the second electrode includes a second pattern portion disposed on the first pattern portion and having a pattern shape corresponding to the first pattern portion on a surface of the second pattern portion, and
the first insulating layer includes a third pattern portion disposed on the second pattern portion of each of the first electrode and the second electrode and having a pattern shape corresponding to the second pattern portion on a surface the third pattern portion.

20. The display device of claim 19, further comprising:
a first contact electrode disposed on the first electrode and contacting the first electrode and an end of the one of the light emitting elements; and
a second contact electrode disposed on the second electrode and contacting the second electrode and another end of the one of the light emitting elements, wherein
each of the first contact electrode and the second contact electrode includes a fourth pattern portion disposed on the third pattern portion and having a pattern shape corresponding to the third pattern portion on a surface of the fourth pattern portion, and
the first insulating layer has a smaller refractive index than each of a refractive index of the first contact electrode and a refractive index of the second contact electrode.

* * * * *